US010303061B2

(12) United States Patent
Nishimura et al.

(10) Patent No.: US 10,303,061 B2
(45) Date of Patent: May 28, 2019

(54) EXTREME ULTRAVIOLET LIGHT GENERATION DEVICE

(71) Applicant: Gigaphoton Inc., Tochigi (JP)

(72) Inventors: Yuichi Nishimura, Oyama (JP); Takayuki Yabu, Oyama (JP); Yoshifumi Ueno, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/001,239

(22) Filed: Jun. 6, 2018

(65) Prior Publication Data
US 2018/0284617 A1 Oct. 4, 2018

Related U.S. Application Data

(63) Continuation of application No. PCT/JP2016/052469, filed on Jan. 28, 2016.

(51) Int. Cl.
G03F 7/20 (2006.01)
H05G 2/00 (2006.01)

(52) U.S. Cl.
CPC ......... *G03F 7/70033* (2013.01); *H05G 2/005* (2013.01); *H05G 2/008* (2013.01)

(58) Field of Classification Search
CPC ..... G03F 7/70033; H05G 2/005; H05G 2/008
See application file for complete search history.

(56) References Cited

U.S. PATENT DOCUMENTS 7,329,884 B2 * 2/2008 Kondo .................. B82Y 10/00
250/492.2

7,960,701 B2 * 6/2011 Bowering .............. B82Y 10/00
250/372

(Continued)

FOREIGN PATENT DOCUMENTS

JP 2007-109451 A 4/2007
JP 2013-004258 A 1/2013

(Continued)

OTHER PUBLICATIONS

International Search Report issued in PCT/JP2016/052469; dated Apr. 26, 2016.

(Continued)

*Primary Examiner* — David P Porta
*Assistant Examiner* — Djura Malevic
(74) *Attorney, Agent, or Firm* — Studebaker & Brackett PC

(57) ABSTRACT

An extreme ultraviolet light generation device includes: an EUV sensor configured to measure energy of extreme ultraviolet light generated when a target is irradiated with a plurality of laser beams in a predetermined region in a chamber; an irradiation position adjustment unit configured to adjust at least one of irradiation positions of the laser beams with which the target is irradiated in the predetermined region; an irradiation timing adjustment unit configured to adjust at least one of irradiation timings of the laser beams with which the target is irradiated in the predetermined region; and a control unit configured to control the irradiation position adjustment unit and the irradiation timing adjustment unit, the control unit controlling the irradiation position adjustment unit and then controlling the irradiation timing adjustment unit based on a measurement result of the EUV sensor.

20 Claims, 20 Drawing Sheets

(56) References Cited

U.S. PATENT DOCUMENTS

| | | | |
|---|---|---|---|
| 8,598,552 B1 | 12/2013 | Frihauf et al. | |
| 8,653,491 B2 * | 2/2014 | Partlo | H05G 2/003 250/504 R |
| 9,119,278 B2 * | 8/2015 | Chrobak | H05G 2/003 |
| 9,271,381 B2 * | 2/2016 | Fleurov | H05G 2/008 |
| 9,426,872 B1 * | 8/2016 | Riggs | H05G 2/008 |
| 9,448,343 B2 * | 9/2016 | Kvamme | G02B 5/0891 |
| 2003/0179377 A1 * | 9/2003 | Masaki | G03F 7/70233 356/400 |
| 2006/0151718 A1 * | 7/2006 | Kondo | B82Y 10/00 250/492.2 |
| 2007/0285643 A1 * | 12/2007 | Wedowski | G01B 11/0625 355/67 |
| 2010/0192973 A1 * | 8/2010 | Ueno | B08B 7/0042 134/1.1 |
| 2010/0258750 A1 * | 10/2010 | Partlo | H05G 2/003 250/504 R |
| 2011/0285975 A1 * | 11/2011 | Tawarayama | G03B 27/52 355/30 |
| 2012/0243566 A1 | 9/2012 | Hori et al. | |
| 2013/0043401 A1 | 2/2013 | Graham et al. | |
| 2013/0077073 A1 | 3/2013 | Van Schoot et al. | |
| 2013/0119232 A1 | 5/2013 | Moriya et al. | |
| 2014/0103229 A1 * | 4/2014 | Chroback | H05G 2/003 250/504 R |
| 2015/0230325 A1 * | 8/2015 | Fleurov | H05G 2/008 250/338.1 |
| 2016/0209753 A1 * | 7/2016 | Zhao | G03F 7/70033 |
| 2017/0048960 A1 * | 2/2017 | Riggs | H05G 2/008 |
| 2017/0070024 A1 * | 3/2017 | Kawasuji | H01L 21/027 |
| 2017/0181258 A1 * | 6/2017 | Ershov | H05G 2/008 |

FOREIGN PATENT DOCUMENTS

| | | |
|---|---|---|
| JP | 2013-074292 A | 4/2013 |
| JP | 2013-105725 A | 5/2013 |
| JP | 2014-531743 A | 11/2014 |
| WO | 2006/049274 A1 | 5/2006 |

OTHER PUBLICATIONS

International Preliminary Report on Patentability and Translation of Written Opinion of the International Searching Authority; PCT/JP2016/052469; dated Jul. 31, 2018.

* cited by examiner

[Fig. 1]
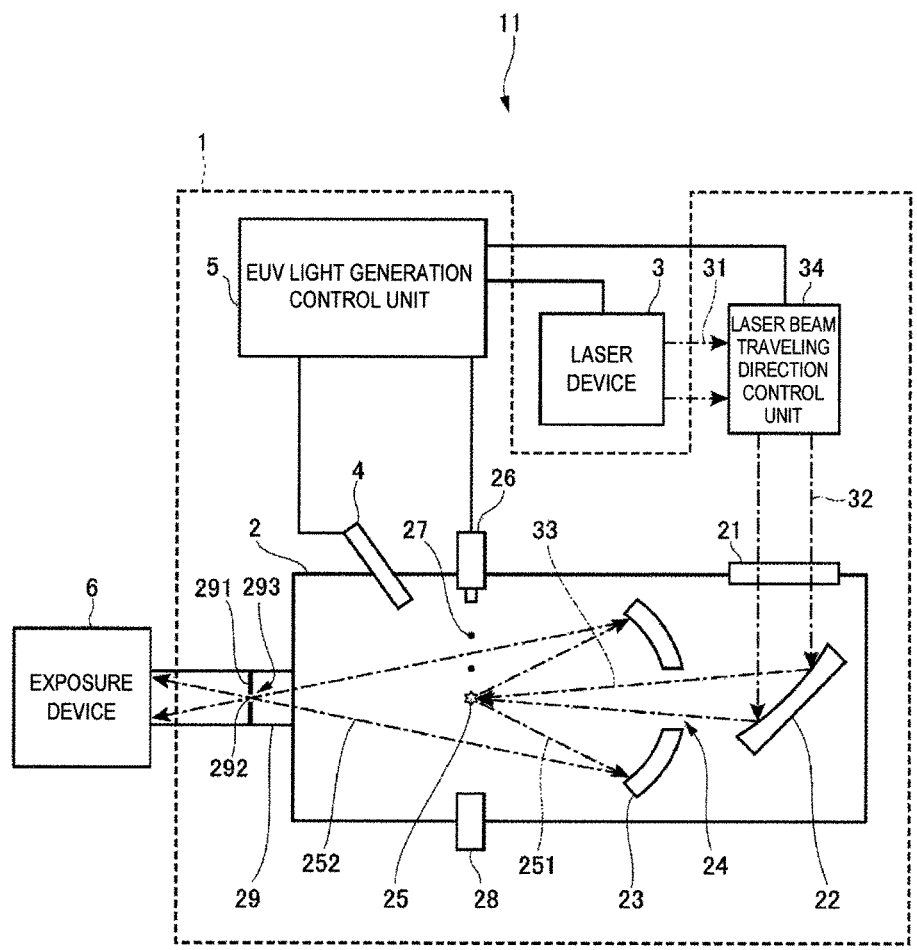

[Fig. 2]
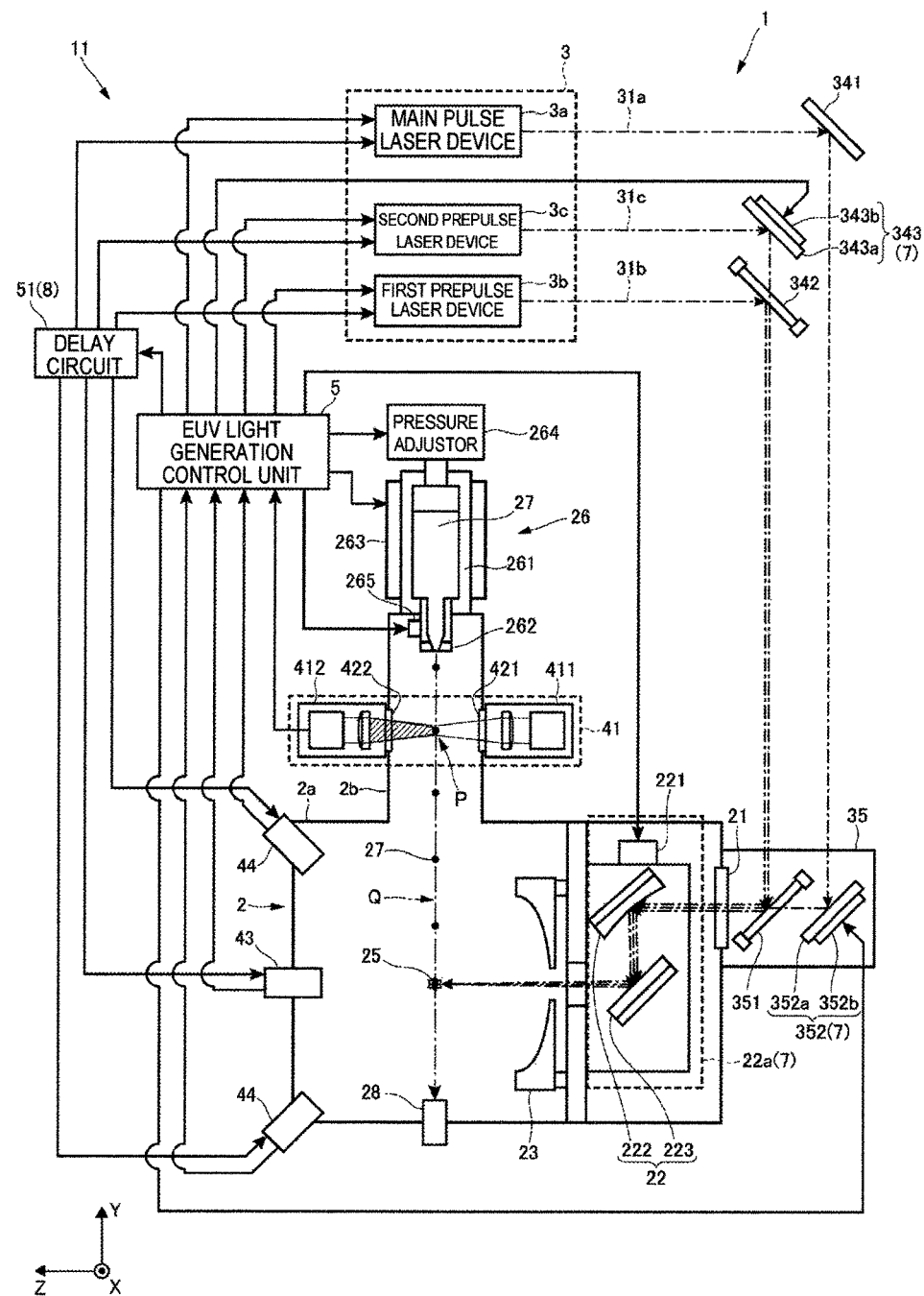

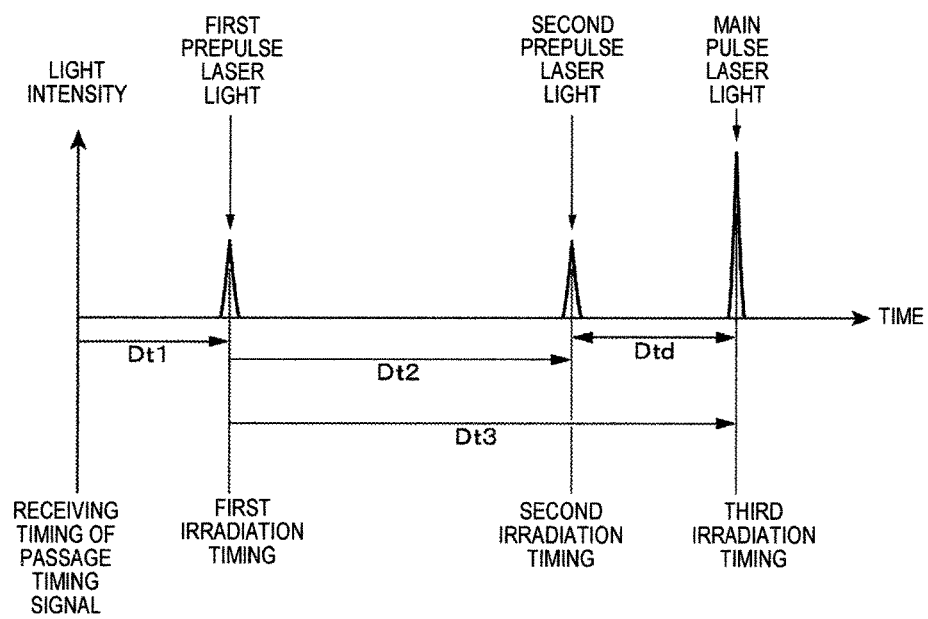

[Fig. 4]
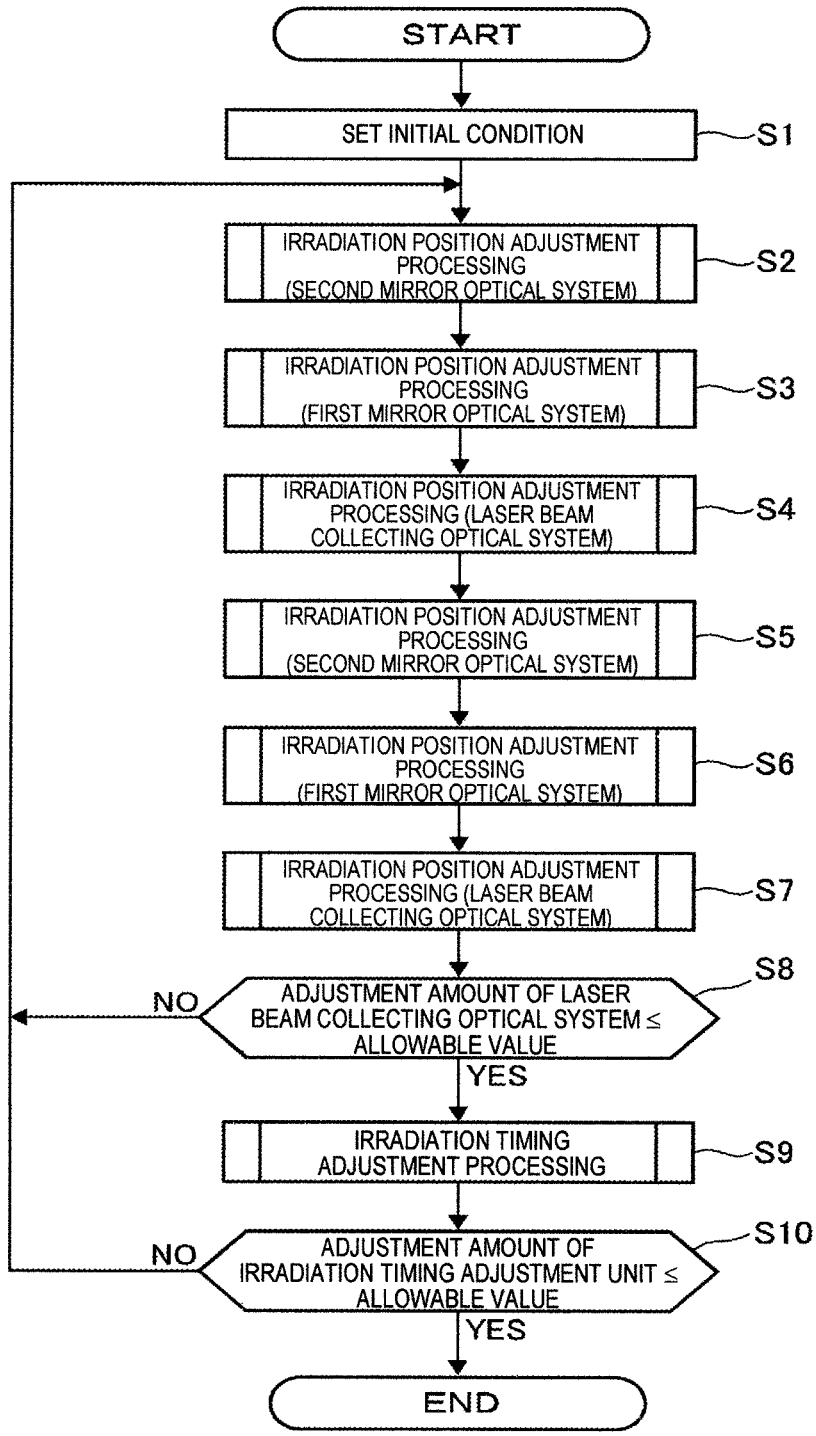

[Fig. 5]
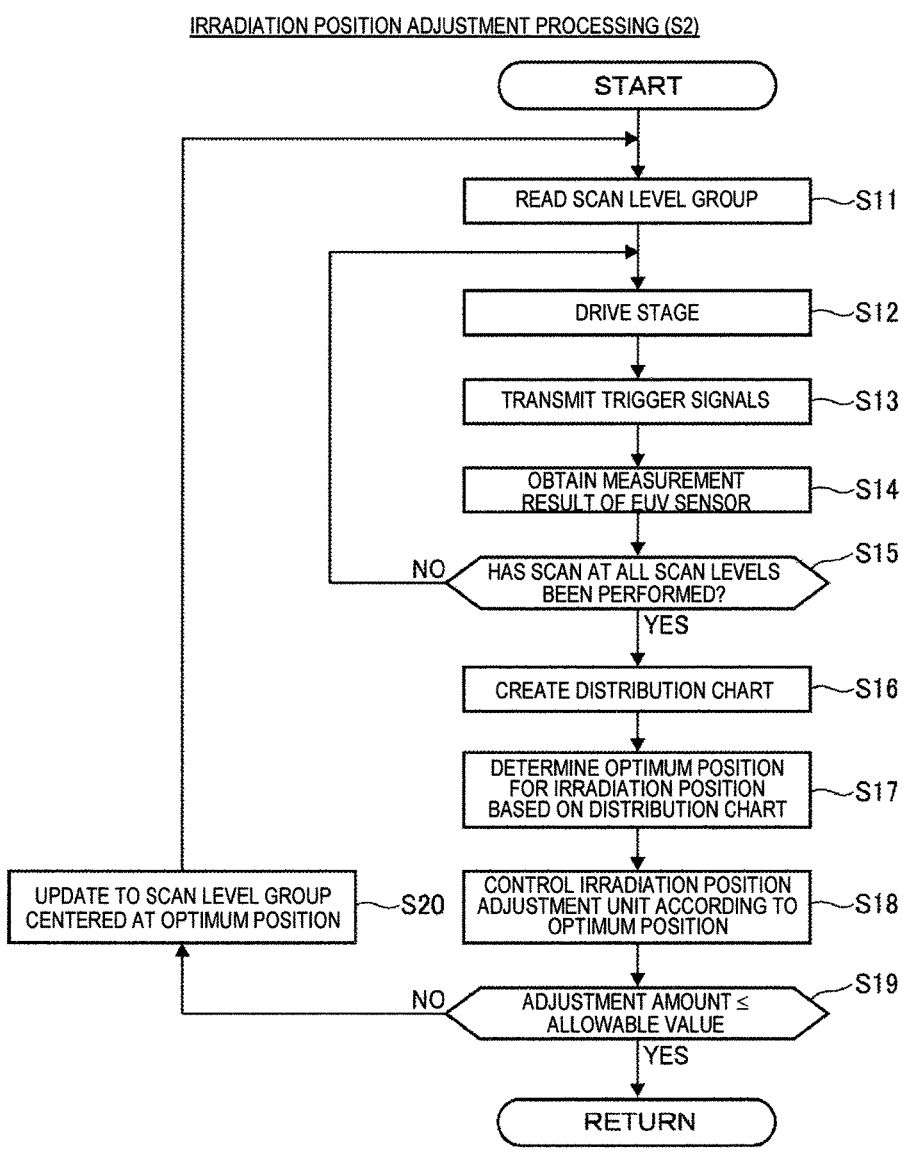

[Fig. 6]

| | | 1x[um] | | | | | | |
|---|---|---|---|---|---|---|---|---|
| | | -30 | -20 | -10 | 0 | 10 | 20 | 30 |
| 1y [um] | -30 | | | | | | | |
| | -20 | | | | | | | |
| | -10 | | | | | | | |
| | 0 | | | | | | | |
| | 10 | | | | | | | |
| | 20 | | | | | | | |
| | 30 | | | | | | | |

[Fig. 7]

ENERGY OF EUV LIGHT [mJ]

| | | 1x[um] | | | | | | |
|---|---|---|---|---|---|---|---|---|
| | | -30 | -20 | -10 | 0 | 10 | 20 | 30 |
| 1y [um] | -30 | 1.74 | 3.53 | 4.69 | 6.82 | 7.63 | 7.15 | 5.58 |
| | -20 | 3.38 | 5.68 | 8.1 | 9.01 | 8.89 | 7.8 | 6.17 |
| | -10 | 5.22 | 7.99 | 9.35 | 9.51 | 9.4 | 8.38 | 6.38 |
| | 0 | 6.47 | 8.32 | 9.56 | 9.61 | 9.3 | 8.07 | 5.84 |
| | 10 | 6.87 | 8.08 | 8.98 | 9.42 | 9.26 | 8.39 | 5.79 |
| | 20 | 6.19 | 6.8 | 7.92 | 8.56 | 8.75 | 8.42 | 6.11 |
| | 30 | 5.36 | 5.35 | 6.73 | 8.32 | 8.36 | 8.46 | 6.64 |

[Fig. 8]
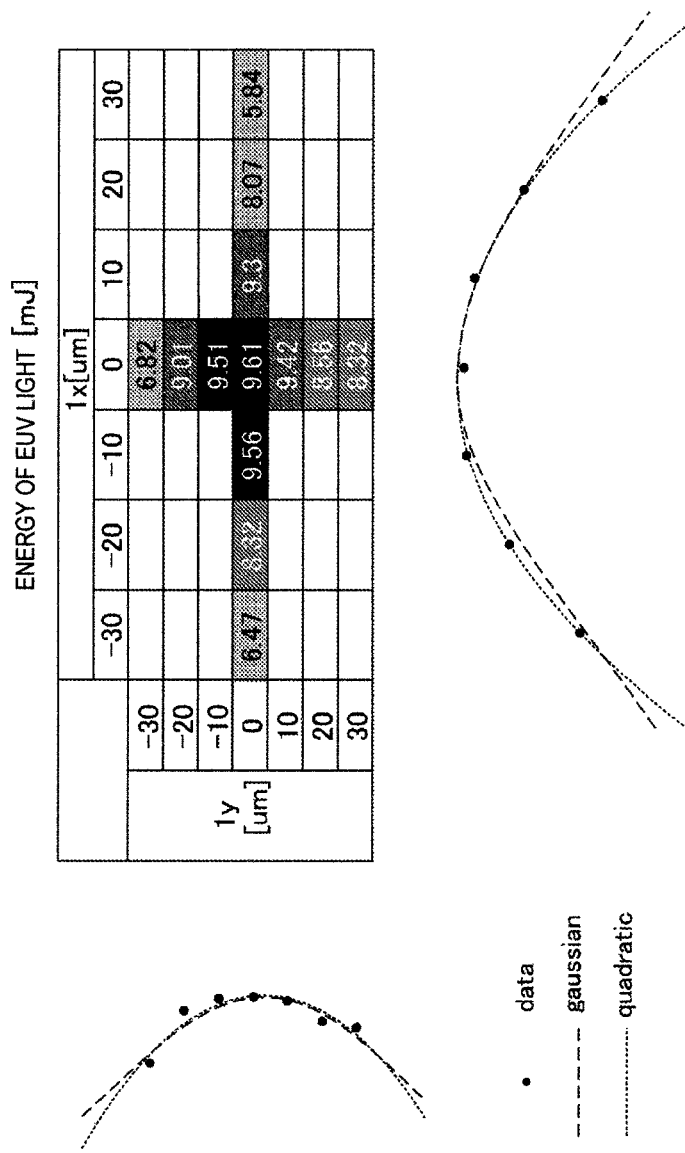

[Fig. 9]
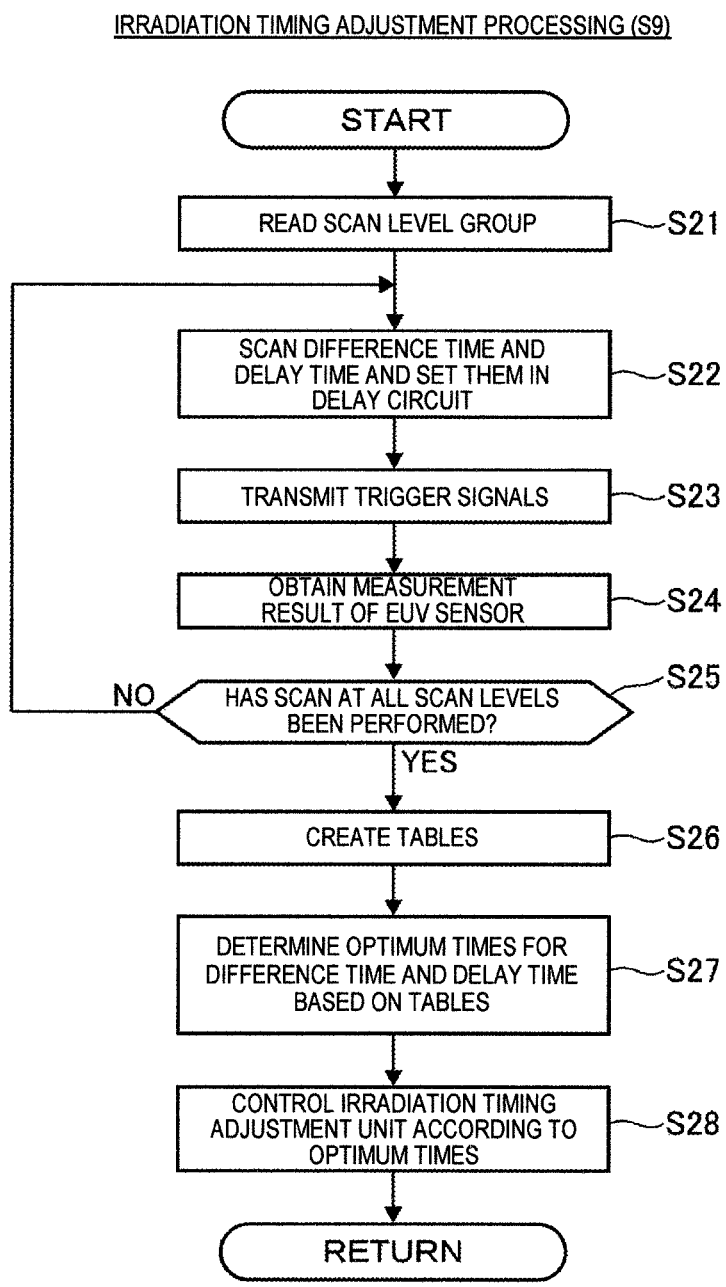

[Fig. 10]

| | | Dt3[ns] | | | | | | | |
|---|---|---|---|---|---|---|---|---|---|
| | | 600 | 800 | 1000 | 1200 | 1400 | 1600 | 1800 | 2000 |
| Dtd [ns] | 100 | | | | | | | | |
| | 150 | | | | | | | | |
| | 200 | | | | | | | | |
| | 250 | | | | | | | | |
| | 300 | | | | | | | | |

[Fig. 11]

VARIATIONS IN ENERGY OF EUV LIGHT [%]

|  |  | Dt3[ns] | | | | | | | |
|---|---|---|---|---|---|---|---|---|---|
|  |  | 600 | 800 | 1000 | 1200 | 1400 | 1600 | 1800 | 2000 |
| Dtd [ns] | 100 | 25 | 18 | 18 | 19 | 22 | 35 | 45 | 71 |
|  | 150 | 17 | 16 | 16 | 17 | 18 | 19 | 25 | 37 |
|  | 200 | 20 | 13 | 10 | 12 | 14 | 27 | 44 | 68 |
|  | 250 | 27 | 13 | 11 | 10 | 14 | 36 | 65 | 93 |
|  | 300 | 33 | 22 | 19 | 18 | 24 | 47 | 77 | 98 |

RANGE IN WHICH VARIATIONS IN ENERGY OF EUV LIGHT IS IN TOP 10%

[Fig. 12]

ENERGY OF EUV LIGHT [mJ]

|  |  | Dt3[ns] | | | | | | | |
|---|---|---|---|---|---|---|---|---|---|
|  |  | 600 | 800 | 1000 | 1200 | 1400 | 1600 | 1800 | 2000 |
| Dtd [ns] | 100 | 6.10 | 6.20 | 6.80 | 6.90 | 6.50 | 5.90 | 5.50 | 4.60 |
|  | 150 | 6.20 | 6.40 | 7.00 | 7.70 | 7.80 | 7.90 | 7.00 | 5.60 |
|  | 200 | 6.30 | 8.10 | 8.30 | 8.60 | 9.00 | 8.40 | 6.70 | 5.50 |
|  | 250 | 6.25 | 8.80 | 9.20 | 9.60 | 9.50 | 7.90 | 5.40 | 4.00 |
|  | 300 | 6.13 | 6.10 | 7.40 | 8.30 | 8.40 | 5.40 | 3.20 | 2.00 |

SCAN LEVEL WITH MAXIMUM ENERGY OF EUV LIGHT WITHIN RANGE IN WHICH VARIATIONS IN ENERGY OF EUV LIGHT IS IN TOP 10%

[Fig. 13]

ENERGY OF EUV LIGHT [mJ]

| | | Dt3 [ns] | | | | | | | |
|---|---|---|---|---|---|---|---|---|---|
| | | 600 | 800 | 1000 | 1200 | 1400 | 1600 | 1800 | 2000 |
| Dtd [ns] | 100 | 6.10 | 6.20 | 6.80 | 6.90 | 6.50 | 5.90 | 5.50 | 4.60 |
| | 150 | 6.20 | 6.40 | 7.00 | 7.70 | 7.80 | 7.90 | 7.00 | 5.60 |
| | 200 | 6.30 | 8.10 | 8.30 | 8.60 | 9.00 | 8.40 | 6.70 | 5.50 |
| | 250 | 6.25 | 8.80 | 9.20 | 9.60 | 9.50 | 7.90 | 5.40 | 4.00 |
| | 300 | 6.13 | 6.10 | 7.40 | 8.30 | 8.40 | 5.40 | 3.20 | 2.00 |

RANGE IN WHICH ENERGY OF EUV LIGHT IS IN TOP 10%

[Fig. 14]

VARIATIONS IN ENERGY OF EUV LIGHT [%]

| | | Dt3 [ns] | | | | | | | |
|---|---|---|---|---|---|---|---|---|---|
| | | 600 | 800 | 1000 | 1200 | 1400 | 1600 | 1800 | 2000 |
| Dtd [ns] | 100 | 25 | 18 | 18 | 19 | 22 | 35 | 45 | 71 |
| | 150 | 17 | 16 | 16 | 17 | 18 | 19 | 25 | 37 |
| | 200 | 20 | 13 | 10 | 12 | 14 | 27 | 44 | 68 |
| | 250 | 27 | 13 | 11 | 10 | 14 | 36 | 65 | 93 |
| | 300 | 33 | 22 | 19 | 18 | 24 | 47 | 77 | 98 |

SCAN LEVEL WITH MINIMUM VARIATIONS IN ENERGY OF EUV LIGHT
WITHIN RANGE IN WHICH ENERGY OF EUV LIGHT IS IN TOP 10%

[Fig. 15]
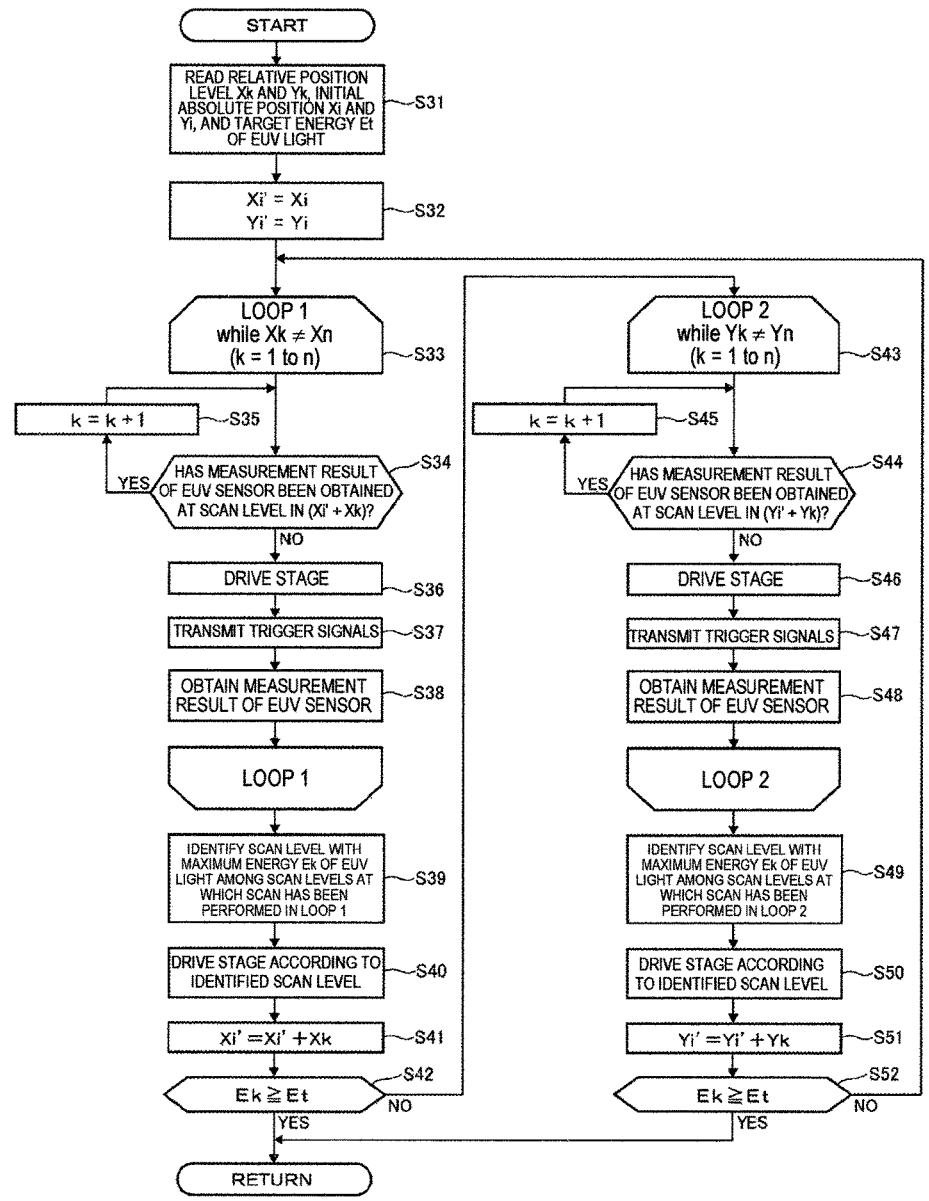

[Fig. 16]

ENERGY OF EUV LIGHT [mJ]

|  |  | X [um] | | | | |
| --- | --- | --- | --- | --- | --- | --- |
|  |  | -20 | -10 | 0 | 10 | 20 |
| Y[um] | -20 | 1.59 | 1.59 | 0.98 | 3.62 | 7.97 |
|  | -10 | 1.59 | 1.38 | 2.53 | 7.26 | 9.14 |
|  | 0 | 2.25 | 1.83 | 4 | 8.24 | 9.97 |
|  | 10 | 1.17 | 1.24 | 5.17 | 7.61 | 6.85 |
|  | 20 | 2.4 | 1.22 | 4.26 | 4.83 | 4.85 |

[Fig. 17]

|  |  | X [um] | | | | |
| --- | --- | --- | --- | --- | --- | --- |
|  |  | -20 | -10 | 0 | 10 | 20 |
| Y[um] | -20 |  |  |  |  |  |
|  | -10 |  |  | start | 5 |  |
|  | 0 |  | 2 | 1 | 3 | 6 |
|  | 10 |  |  |  | 4 |  |
|  | 20 |  |  |  |  |  |

A  B  C

[Fig. 18]
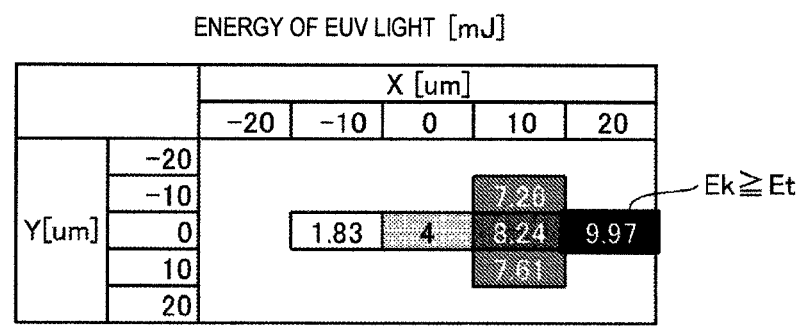

[Fig. 19]
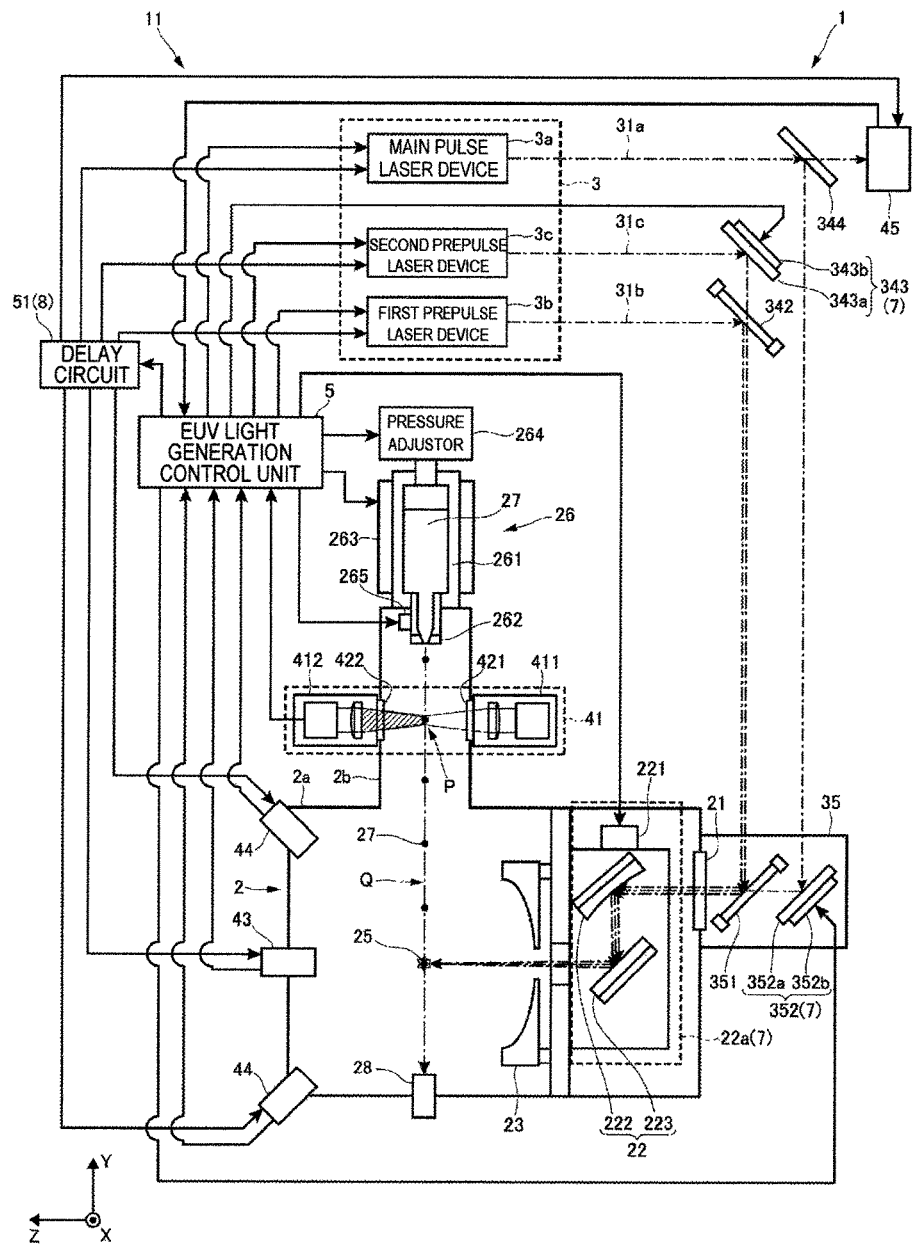

[Fig. 20]
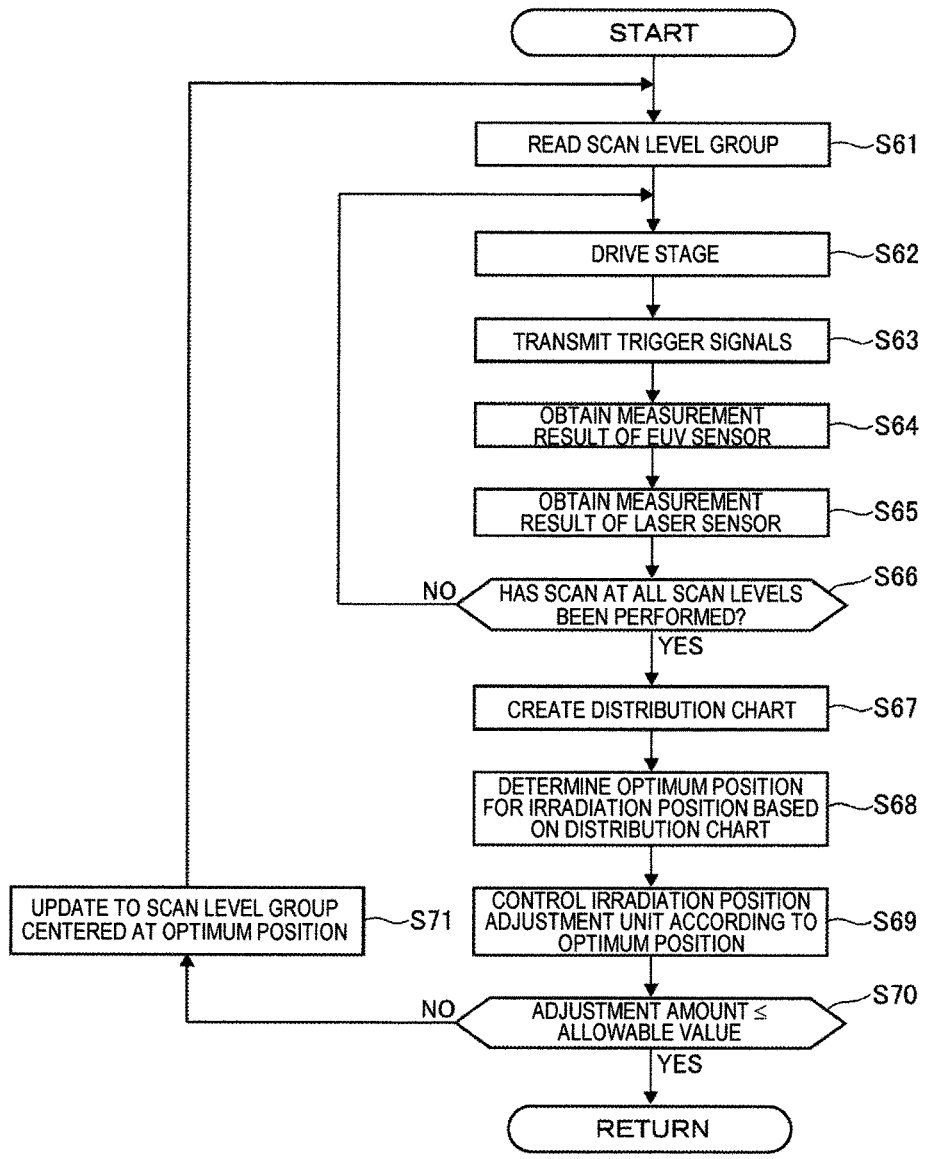

[Fig. 21]
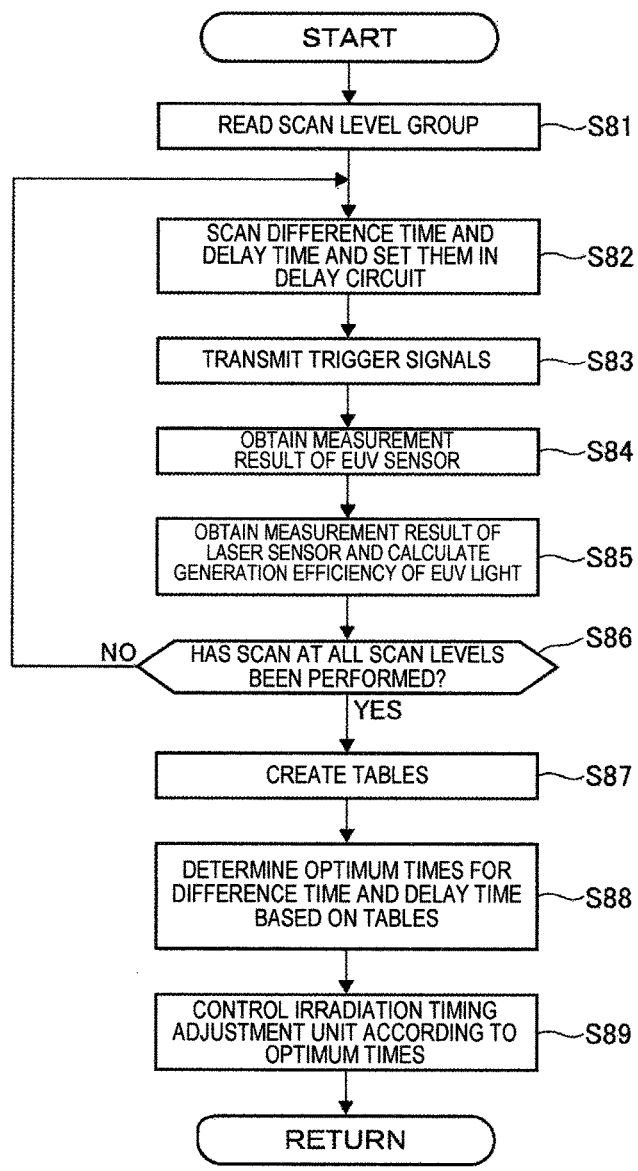

[Fig. 22]
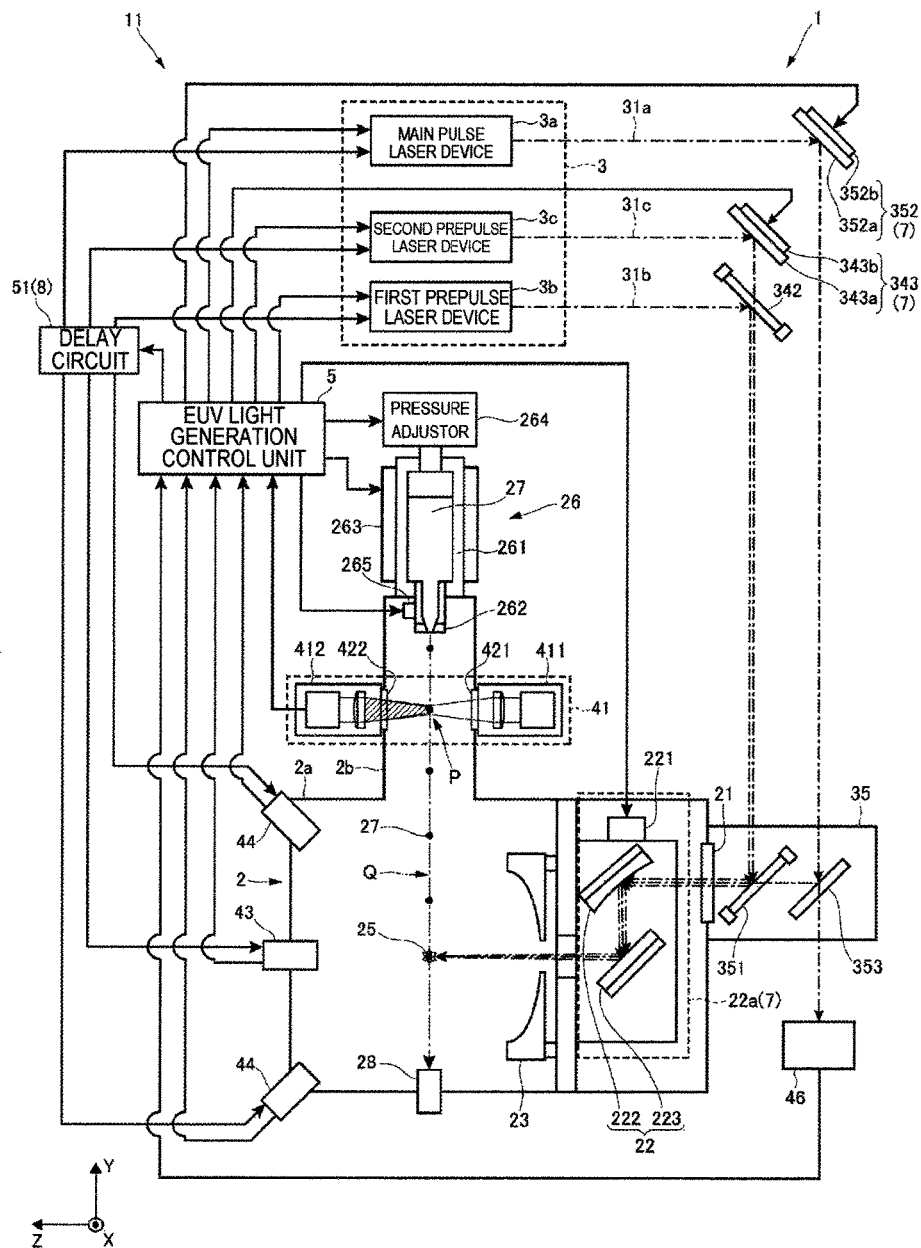

[Fig. 23]
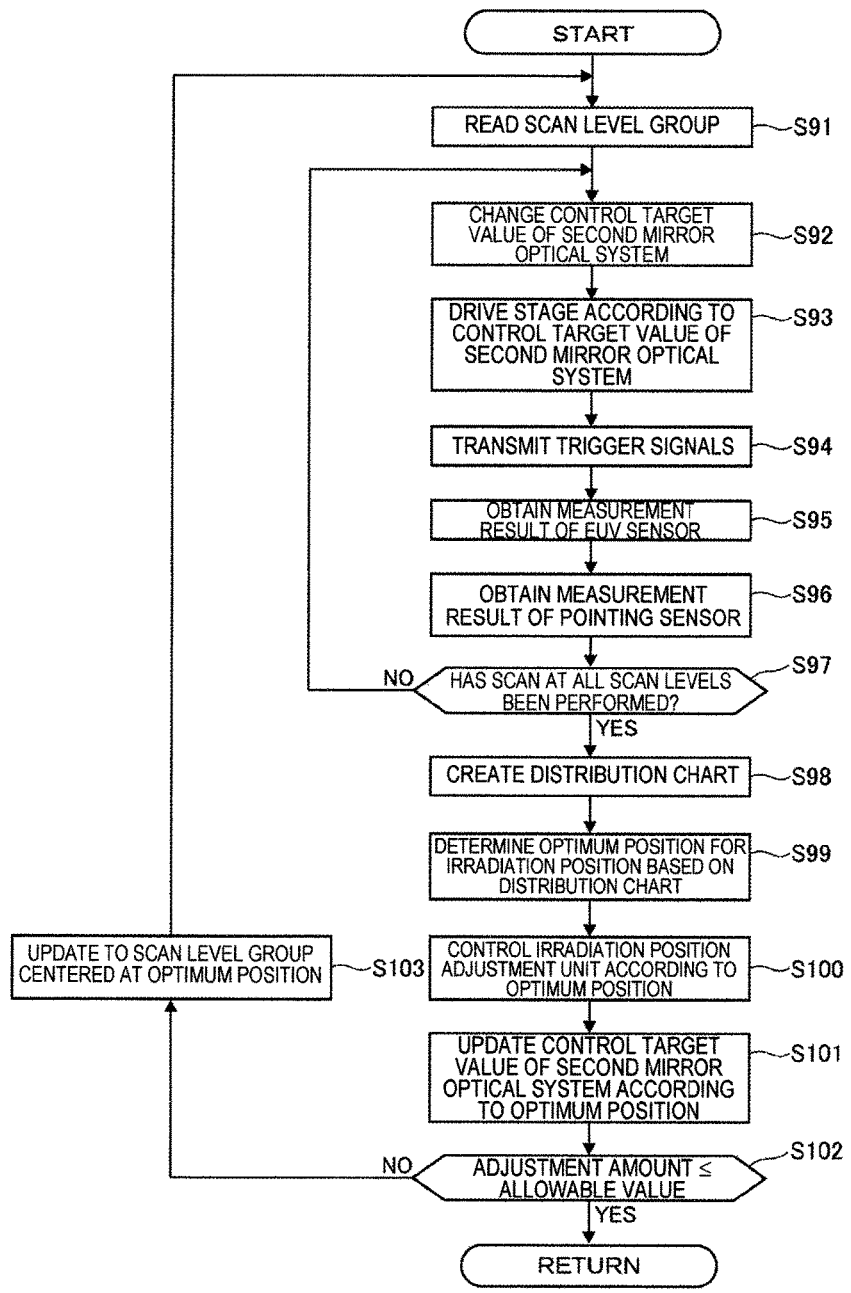

[Fig. 24]
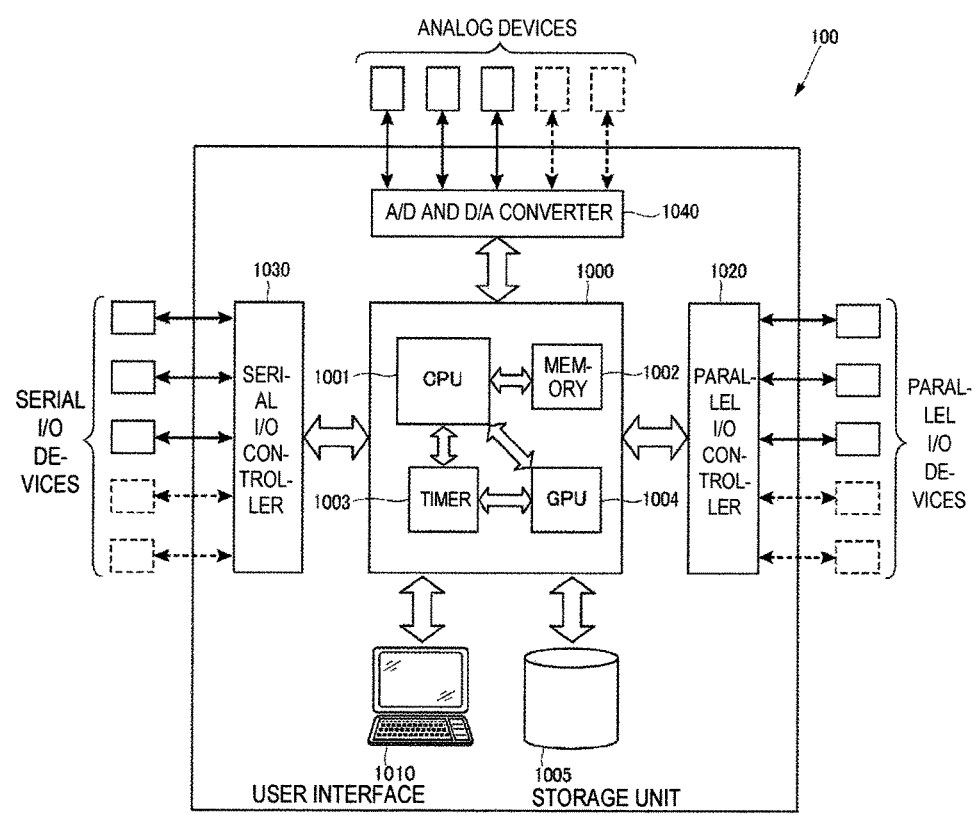

EXTREME ULTRAVIOLET LIGHT GENERATION DEVICE

CROSS-REFERENCE TO RELATED APPLICATIONS

The present application is a continuation application of International Application No. PCT/JP2016/052469 filed on Jan. 28, 2016. The content of the application is incorporated herein by reference in its entirety.

BACKGROUND

1. Technical Field

The present disclosure relates to an extreme ultraviolet light generation device.

2. Related Art

In recent years, as semiconductor processes have become finer, transfer patterns for use in photolithography of semiconductor processes have become finer at a high pace. In the next generation, microfabrication at 20 nm or less will be in demand. Thus, there is expectation for development of an exposure device including a combination of an extreme ultraviolet (EUV) light generation device configured to generate extreme ultraviolet (EUV) light having a wavelength of about 13 nm and a reduced projection reflective optical system.

Three types of EUV light generation devices have been proposed: an LPP (Laser Produced Plasma) type device using plasma generated by irradiating a target with a laser beam, a DPP (Discharge Produced Plasma) type device using plasma generated by electric discharge, and an SR (Synchrotron Radiation) type device using synchrotron orbital radiation.

CITATION LIST

Patent Literature

Patent Literature 1: National Publication of International Patent Application No. 2014-531743
Patent Literature 2: Japanese Patent Laid-Open No. 2013-74292
Patent Literature 3: U.S. Pat. No. 8,598,552

SUMMARY

An extreme ultraviolet light generation device according to an aspect of the present disclosure includes: an EUV sensor configured to measure energy of extreme ultraviolet light generated when a target is irradiated with a plurality of laser beams in a predetermined region in a chamber; an irradiation position adjustment unit configured to adjust at least one of irradiation positions of the laser beams with which the target is irradiated in the predetermined region; an irradiation timing adjustment unit configured to adjust at least one of irradiation timings of the laser beams with which the target is irradiated in the predetermined region; and a control unit configured to control the irradiation position adjustment unit and the irradiation timing adjustment unit. The control unit may control the irradiation position adjustment unit and then control the irradiation timing adjustment unit based on a measurement result of the EUV sensor.

BRIEF DESCRIPTION OF THE DRAWINGS

With reference to the accompanying drawings, some embodiments of the present disclosure will be described below merely by way of example.

FIG. 1 schematically shows a configuration of an exemplary LPP type EUV light generation system.
FIG. 2 illustrates a configuration of an EUV light generation system according to a comparative example.
FIG. 3 illustrates a timing when a target is irradiated with a pulse laser beam output from a laser device in FIG. 2.
FIG. 4 is a flowchart of adjustment processings of an irradiation position and an irradiation timing of the pulse laser beam.
FIG. 5 is a flowchart of the irradiation position adjustment processing in steps S2 to S7 in FIG. 4.
FIG. 6 illustrates a scan level group in the irradiation position adjustment processing in FIG. 5.
FIG. 7 illustrates a distribution chart of energy of EUV light created based on the scan level group in FIG. 6.
FIG. 8 illustrates an approximate curve obtained from the distribution chart in FIG. 7.
FIG. 9 is a flowchart of the irradiation timing adjustment processing in step S9 in FIG. 4.
FIG. 10 illustrates a scan level group in the irradiation timing adjustment processing in FIG. 9.
FIG. 11 illustrates a second table created based on the scan level group in FIG. 10.
FIG. 12 illustrates a first table created based on the scan level group in FIG. 10.
FIG. 13 illustrates an EUV light generation control unit according to a variant of a first embodiment, and illustrates the first table created based on the scan level group in FIG. 10.
FIG. 14 illustrates the EUV light generation control unit according to the variant of the first embodiment, and illustrates the second table created based on the scan level group in FIG. 10.
FIG. 15 is a flowchart of an irradiation position adjustment processing according to a second embodiment.
FIG. 16 illustrates an overview of the irradiation position adjustment processing in FIG. 15, and illustrates a distribution chart of energy of EUV light.
FIG. 17 illustrates the overview of the irradiation position adjustment processing in FIG. 15, and illustrates an order of progression of scan levels.
FIG. 18 illustrates the overview of the irradiation position adjustment processing in FIG. 15, and illustrates energy associated with the scan levels at which scan has been performed in the order in FIG. 17.
FIG. 19 illustrates a configuration of an EUV light generation device of a third embodiment.
FIG. 20 is a flowchart of an irradiation position adjustment processing according to the third embodiment.
FIG. 21 is a flowchart of an irradiation timing adjustment processing according to the third embodiment.
FIG. 22 illustrates a configuration of an EUV light generation device of a fourth embodiment.
FIG. 23 is a flowchart of an irradiation position adjustment processing according to the fourth embodiment.
FIG. 24 is a block diagram of a hardware environment of control units.

EMBODIMENTS

<Contents>
1. General description of EUV light generation system
   1.1 Configuration
   1.2 Operation
2. Terms
3. Problem 3.1 Configuration of comparative example
3.2 Operation of comparative example
3.3 Problem
4. First embodiment
  4.1 Configuration
  4.2 Operation
  4.3 Effect
  4.4 Variant
5. Second embodiment
  5.1 Operation
  5.2 Effect
6. Third embodiment
  6.1 Configuration
  6.2 Operation
  6.3 Effect
7. Fourth embodiment
  7.1 Configuration
  7.2 Operation
  7.3 Effect
8. Others
  8.1 Hardware environment of control units
  8.2 Other variants etc.

Now, with reference to the drawings, embodiments of the present disclosure will be described in detail. The embodiments described below merely illustrate some examples of the present disclosure, and do not limit contents of the present disclosure. Also, all the configurations and operations described in the embodiments are not necessarily essential as configurations and operations of the present disclosure. Like components are denoted by like reference numerals, and overlapping descriptions are omitted.

[1. General Description of EUV Light Generation System]
  [1.1 Configuration]

FIG. 1 schematically shows a configuration of an exemplary LPP type EUV light generation system.

An EUV light generation device 1 may be used together with at least one laser device 3. In the present application, a system including the EUV light generation device 1 and the laser device 3 is referred to as an EUV light generation system 11. As shown in FIG. 1 and described below in detail, the EUV light generation device 1 may include a chamber 2 and a target supplier 26. The chamber 2 may be sealable. The target supplier 26 may be mounted, for example, so as to extend through a wall of the chamber 2. A material of a target 27 to be supplied from the target supplier 26 may include, but not limited to, tin, terbium, gadolinium, lithium, xenon, or any combination of two of them.

The wall of the chamber 2 may have at least one through hole. A window 21 may be provided in the through hole, and a pulse laser beam 32 output from the laser device 3 may pass through the window 21. In the chamber 2, an EUV collecting mirror 23 having, for example, a spheroidal reflective surface may be arranged. The EUV collecting mirror 23 may have first and second focal points. On a surface of the EUV collecting mirror 23, a multilayer reflective film including, for example, alternately stacked molybdenum and silicon may be formed. The EUV collecting mirror 23 is preferably arranged so that, for example, its first focal point is located in a plasma generation region 25 and its second focal point is located in an intermediate collecting point (IF) 292. A through hole 24 may be provided in a center of the EUV collecting mirror 23, and a pulse laser beam 33 may pass through the through hole 24.

The EUV light generation device 1 may include an EUV light generation control unit 5, a target sensor 4, and the like. The target sensor 4 may have an imaging function, and may be configured to detect presence, a locus, a position, a speed, or the like of the target 27.

The EUV light generation device 1 may include a connection 29 configured to provide communication between insides of the chamber 2 and the exposure device 6. In the connection 29, a wall 291 having an aperture 293 may be provided. The wall 291 may be arranged so that the aperture 293 is located in a second focal point position of the EUV collecting mirror 23.

Further, the EUV light generation device 1 may include a laser beam traveling direction control unit 34, a laser beam collecting mirror 22, a target recovery device 28 for recovering the target 27, and the like. The laser beam traveling direction control unit 34 may include an optical element for defining a traveling direction of the laser beam, and an actuator for adjusting a position, an attitude, or the like of the optical element.

[1.2 Operation]

With reference to FIG. 1, a pulse laser beam 31 output from the laser device 3 may pass through the laser beam traveling direction control unit 34 and pass through the window 21 as the pulse laser beam 32, which enters the chamber 2. The pulse laser beam 32 may travel along at least one laser beam path in the chamber 2, be reflected by the laser beam collecting mirror 22, and be applied as the pulse laser beam 33 to at least one target 27.

The target supplier 26 may be configured to output the target 27 toward the plasma generation region 25 in the chamber 2. The target 27 may be irradiated with at least one pulse contained in the pulse laser beam 33. The target 27 irradiated with the pulse laser beam 33 is turned into plasma, and EUV light 251 can be radiated from the plasma with radiation of light having a different wavelength. The EUV light 251 may be selectively reflected by the EUV collecting mirror 23. EUV light 252 reflected by the EUV collecting mirror 23 may be collected at the intermediate collecting point 292, and output to the exposure device 6. One target 27 may be irradiated with a plurality of pulses contained in the pulse laser beam 33.

The EUV light generation control unit 5 may be configured to collectively control the entire EUV light generation system 11. The EUV light generation control unit 5 may be configured to process image date or the like of the target 27 taken by the target sensor 4. Also, the EUV light generation control unit 5 may perform, for example, at least one of control of output timing of the target 27 and control of an output direction or the like of the target 27. Further, the EUV light generation control unit 5 may perform, for example, at least one of control of output timing of the laser device 3, control of a traveling direction of the pulse laser beam 32, and control of a collecting position of the pulse laser beam 33. The various controls described above are mere examples, and other controls may be added as required.

[2. Terms]

The term "target" refers to an object to be irradiated with a laser beam introduced into the chamber. The target irradiated with the laser beam is turned into plasma and radiates EUV light.

The term "plasma generation region" refers to a predetermined region in the chamber. The plasma generation region is a region in which the target output into the chamber is irradiated with the laser beam and the target is turned into plasma.

The term "target trajectory" refers to a path on which the target output into the chamber travels. The target trajectory may intersect an optical path of the laser beam introduced into the chamber in the plasma generation region.

The term "optical path axis" refers to an axis passing through a center of a beam section of the laser beam along a traveling direction of the laser beam.

The term "optical path" refers to a path along which the laser beam passes. The optical path may include the optical path axis.

The term "Z-axis direction" refers to a traveling direction of the laser beam when the laser beam introduced into the chamber travels toward the plasma generation region 25. The Z-axis direction may be substantially the same as a direction in which the EUV light generation device outputs the EUV light.

The term "Y-axis direction" refers to a direction opposite to a direction in which the target supplier outputs the target into the chamber. The Y-axis direction is a direction perpendicular to an X-axis direction and the Z-axis direction.

The term "X-axis direction" is a direction perpendicular to the Y-axis direction and the Z-axis direction.

[3. Problem]

With reference to FIGS. 2 and 3, an EUV light generation system 11 including an EUV light generation device 1 of a comparative example will be described.

[3.1 Configuration of Comparative Example]

FIG. 2 illustrates a configuration of the EUV light generation system 11 according to the comparative example. FIG. 3 illustrates a timing when a target 27 is irradiated with a pulse laser beam 33 output from a laser device 3 in FIG. 2.

The EUV light generation system 11 according to the comparative example may include the laser device 3 and the EUV light generation device 1.

The laser device 3 according to the comparative example may output a plurality of pulse laser beams so that one target 27 supplied to the plasma generation region 25 is irradiated therewith.

The laser device 3 according to the comparative example may output, as the plurality of pulse laser beams, for example, three pulse laser beams: a first prepulse laser beam 31b, a second prepulse laser beam 31c, and a main pulse laser beam 31a in this order.

The laser device 3 according to the comparative example may include a main pulse laser device 3a, a first prepulse laser device 3b, and a second prepulse laser device 3c.

The main pulse laser device 3a may be a laser device 3 configured to output the main pulse laser beam 31a.

The main pulse laser device 3a may be a gas laser device such as a $CO_2$ laser device or the like.

The main pulse laser beam 31a may be a laser beam with which the target 27 is irradiated for turning the target 27 into plasma to generate EUV light 251.

The first and second prepulse laser devices 3b and 3c may be laser devices 3 configured to output the first and second prepulse laser beams 31b and 31c, respectively.

The first and second prepulse laser devices 3b and 3c may be solid-state laser devices such as YAG laser devices.

The first and second prepulse laser beams 31b and 31c may be laser beams with which the target 27 is irradiated before the target 27 is irradiated with the main pulse laser beam 31a.

The target 27 output from the target supplier 26 and supplied to the plasma generation region 25 is also referred to as a primary target. The first prepulse laser beam 31b may be a laser beam with which the primary target is irradiated.

The primary target with which the first prepulse laser beam 31b has been irradiated is also referred to as a secondary target. The second prepulse laser beam 31c may be a laser beam with which the secondary target is irradiated.

The secondary target with which the second prepulse laser beam 31c has been irradiated is also referred to as a tertiary target. The main pulse laser beam 31a may be a laser beam with which the tertiary target is irradiated.

A timing when the primary target is irradiated with the first prepulse laser beam 31b is also referred to as a first irradiation timing.

A timing when the secondary target is irradiated with the second prepulse laser beam 31c is also referred to as a second irradiation timing.

A timing when the tertiary target is irradiated with the main pulse laser beam 31a is also referred to as a third irradiation timing.

A position where the primary target is irradiated with the first prepulse laser beam 31b is also referred to as an irradiation position of the first prepulse laser beam 31b.

A position where the secondary target is irradiated with the second prepulse laser beam 31c is also referred to as an irradiation position of the second prepulse laser beam 31c.

A position where the tertiary target is irradiated with the main pulse laser beam 31a is also referred to as an irradiation position of the main pulse laser beam 31a.

The irradiation position of the first prepulse laser beam 31b, the irradiation position of the second prepulse laser beam 31c, and the irradiation position of the main pulse laser beam 31a are collectively referred to as an irradiation position of a pulse laser beam 33.

The first prepulse laser beam 31b, the second prepulse laser beam 31c, and the main pulse laser beam 31a are collectively referred to as a pulse laser beam 31. Alternatively, the first prepulse laser beam 31b, the second prepulse laser beam 31c, and the main pulse laser beam 31a are also collectively referred to as a pulse laser beam 32. Alternatively, the first prepulse laser beam 31b, the second prepulse laser beam 31c, and the main pulse laser beam 31a are also collectively referred to as the pulse laser beam 33.

The primary target, the secondary target, and the tertiary target are also collectively referred to as the target 27.

The first irradiation timing, the second irradiation timing, and the third irradiation timing are also collectively referred to as an irradiation timing.

The EUV light generation device 1 according to the comparative example may include a chamber 2, a laser beam collecting optical system 22a, a high reflection mirror 341, a mirror 342, a first mirror optical system 343, and a beam combiner 35. In addition, the EUV light generation device 1 of the comparative example may include the target supplier 26, a target detector 41, an image sensor 43, an EUV sensor 44, an EUV light generation control unit 5, and a delay circuit 51.

The chamber 2 may be a container in which the target supplied into the container is irradiated with the pulse laser beam 33 to generate plasma from the target 27 to generate the EUV light 252.

A wall 2a of the chamber 2 may form an internal space of the chamber 2 and isolates the internal space of the chamber 2 from outside.

The chamber 2 may include a target supply channel 2b through which the target 27 is supplied into the chamber 2.

The laser beam collecting optical system 22a may be an optical system configured to collect the pulse laser beam 32 having entered the chamber 2 through a window 21 in the plasma generation region 25.

The laser beam collecting optical system 22a may be arranged on an optical path of the pulse laser beam 32 having passed through the window 21 and between the window 21 and the plasma generation region 25.

The laser beam collecting optical system 22a may include a laser beam collecting mirror 22 and a stage 221.

The laser beam collecting mirror 22 may reflect the pulse laser beam 32 having passed through the window 21 toward the plasma generation region 25 as the pulse laser beam 33. The laser beam collecting mirror 22 may collect the pulse laser beam 32 having passed through the window 21 in the plasma generation region 25 as the pulse laser beam 33.

The laser beam collecting mirror 22 may be mounted on the stage 221.

The laser beam collecting mirror 22 may include an off-axis paraboloid mirror 222 and a plane mirror 223.

The stage 221 may be a stage configured to adjust at least one of a position and an attitude of the laser beam collecting mirror 22 on three axes: an X-axis, a Y-axis, and a Z-axis.

Specifically, the stage 221 may adjust at least one of the position and the attitude of the laser beam collecting mirror 22 so that the primary target is irradiated with the first prepulse laser beam 31b in the plasma generation region 25. The stage 221 may adjust at least one of the position and the attitude of the laser beam collecting mirror 22 so that the secondary target is irradiated with the second prepulse laser beam 31c in the plasma generation region 25. The stage 221 may adjust at least one of the position and the attitude of the laser beam collecting mirror 22 so that the tertiary target is irradiated with the main pulse laser beam 31a in the plasma generation region 25.

Driving of the stage 221 may be controlled by the EUV light generation control unit 5.

The high reflection mirror 341 may be arranged on an optical path of the main pulse laser beam 31a output from the main pulse laser device 3a and between the main pulse laser device 3a and the beam combiner 35.

The high reflection mirror 341 may reflect the main pulse laser beam 31a output from the main pulse laser device 3a toward the beam combiner 35.

The mirror 342 may be arranged on an optical path of the first prepulse laser beam 31b output from the first prepulse laser device 3b and between the first prepulse laser device 3b and the beam combiner 35. The mirror 342 may be arranged on an optical path of the second prepulse laser beam 31c reflected by the first mirror optical system 343 and between the first mirror optical system 343 and the beam combiner 35.

The mirror 342 may reflect the first prepulse laser beam 31b output from the first prepulse laser device 3b toward the beam combiner 35. The mirror 342 may pass therethrough the second prepulse laser beam 31c reflected by the first mirror optical system 343 toward the beam combiner 35.

The first mirror optical system 343 may be arranged on an optical path of the second prepulse laser beam 31c output from the second prepulse laser device 3c and between the second prepulse laser device 3c and the mirror 342. The first mirror optical system 343 may be arranged on an optical path of the second prepulse laser beam 31c before entering the laser beam collecting optical system 22a.

The first mirror optical system 343 may include a high reflection mirror 343a and a stage 343b.

The high reflection mirror 343a may be a mirror having high reflectance with respect to a wavelength of the second prepulse laser beam 31c.

The high reflection mirror 343a may be mounted on the stage 343b.

The high reflection mirror 343a may reflect the second prepulse laser beam 31c output from the second prepulse laser device 3c through the mirror 342 toward the beam combiner 35.

The stage 343b may adjust at least one of a position and an attitude of the high reflection mirror 343a. The stage 343b may adjust the position and the attitude of the high reflection mirror 343a so that an optical path axis of the second prepulse laser beam 31c reflected by the high reflection mirror 343a is substantially the same as an optical path axis of the first prepulse laser beam 31b reflected by the mirror 342.

Driving of the stage 343b may be controlled by the EUV light generation control unit 5.

The beam combiner 35 may be an optical system configured to introduce the first and second prepulse laser beams 31b and 31c and the main pulse laser beam 31a into the chamber 2 with substantially the same optical path axis.

The beam combiner 35 may be connected to the wall 2a of the chamber 2 near the window 21.

The beam combiner 35 may include a dichroic mirror 351 and a second mirror optical system 352.

The dichroic mirror 351 may be formed of a diamond substrate. A surface of the diamond substrate may be coated with a film having high reflectance with respect to wavelengths of the first and second prepulse laser beams 31b and 31c and high transmittance with respect to a wavelength of the main pulse laser beam 31a.

The dichroic mirror 351 may be arranged on optical paths of the first prepulse laser beam 31b reflected by the mirror 342 and the second prepulse laser beam 31c having passed through the mirror 342 and between the mirror 342 and the window 21. The dichroic mirror 351 may be arranged on an optical path of the main pulse laser beam 31a reflected by the second mirror optical system 352 and between the second mirror optical system 352 and the window 21.

The dichroic mirror 351 may reflect the first prepulse laser beam 31b reflected by the mirror 342 and the second prepulse laser beam 31c having passed through the mirror 342, through the window 21 toward the laser beam collecting optical system 22a. The dichroic mirror 351 may pass therethrough the main pulse laser beam 31a reflected by the second mirror optical system 352 toward the window 21.

The second mirror optical system 352 may be arranged on an optical path of the main pulse laser beam 31a reflected by the high reflection mirror 341 and between the high reflection mirror 341 and the dichroic mirror 351. The second mirror optical system 352 may be arranged on an optical path of the main pulse laser beam 31a before entering the laser beam collecting optical system 22a.

The second mirror optical system 352 may include a high reflection mirror 352a and a stage 352b.

The high reflection mirror 352a may be a mirror having high reflectance with respect to the wavelength of the main pulse laser beam 31a.

The high reflection mirror 352a may be mounted on the stage 352b.

The high reflection mirror 352a may reflect the main pulse laser beam 31a reflected by the high reflection mirror 341 through the dichroic mirror 351 and the window 21 toward the laser beam collecting optical system 22a.

The stage 352b may adjust at least one of a position and an attitude of the high reflection mirror 352a.

The stage 352b may adjust the position and the attitude of the high reflection mirror 352a so that an optical path axis of the main pulse laser beam 31a reflected by the high reflection mirror 352a is substantially the same as an optical path axis of the first prepulse laser beam 31b reflected by the dichroic mirror 351.

Driving of the stage 352b may be controlled by the EUV light generation control unit 5.

The target supplier 26 may be a device configured to melt the target 27 to be supplied into the chamber 2 and output the target 27 in the form of droplets toward the plasma generation region 25. The target supplier 26 may be a device configured to output the target 27 in a so-called continuous jet manner.

The target 27 supplied by the target supplier 26 may be formed of a metal material. The metal material forming the target 27 may include tin, terbium, gadolinium, or any combination of two of them. Preferably, the metal material forming the target 27 may be tin.

The target supplier 26 may be provided at an end of the target supply channel 2b of the chamber 2.

The target supplier 26 may include a tank 261, a nozzle 262, a heater 263, a pressure adjustor 264, and a piezoelectric element 265.

An operation of the target supplier 26 may be controlled by the EUV light generation control unit 5.

The target detector 41 may be a detector configured to detect the target 27 output into the chamber 2.

Specifically, the target detector 41 may be a detector configured to detect a timing when the target 27 passes through a predetermined detection region P, which lies in a predetermined position in the chamber 2. The predetermined position including the detection region P may be a position on a target trajectory Q between the target supplier 26 and the plasma generation region 25.

The target detector 41 may include an illumination unit 411 and a detection unit 412.

The illumination unit 411 and the detection unit 412 may be connected via a window 421 and a window 422, respectively, to the wall 2a of the target supply channel 2b.

The illumination unit 411 and the detection unit 412 may be arranged to face each other across the detection region P on the target trajectory Q.

The illumination unit 411 may output illumination light toward the detection region P so as to illuminate the target 27 passing through the detection region P.

The detection unit 412 may detect light intensity of the illumination light output so as to illuminate the target 27 passing through the detection region P, thereby detecting the target 27 passing through the detection region P.

The light intensity of the illumination light detected by the detection unit 412 may change every time the target 27 passes through the detection region P. The detection unit 412 may generate a detection signal according to the change in the detected light intensity of the illumination light, and transmit the detection signal to the EUV light generation control unit 5.

The detection signal according to the change in the light intensity of the illumination light detected by the detection unit 412 is also referred to as a passage timing signal.

The image sensor 43 may be a sensor configured to obtain an image of around the plasma generation region 25.

The image sensor 43 may be provided on the wall 2a of the chamber 2 so as to face the plasma generation region 25.

The image sensor 43 may obtain images of the target 27 and plasma generated from the target 27 in the plasma generation region 25, and transmit the images to the EUV light generation control unit 5.

An operation of the image sensor 43 may be controlled by the EUV light generation control unit 5.

The EUV sensor 44 may be a sensor configured to measure energy of the EUV light 251 radiated from the plasma.

The EUV sensor 44 may include a plurality of EUV sensors 44.

The EUV sensors 44 may be provided on the wall 2a of the chamber 2 so as to face the plasma generation region 25.

The EUV sensors 44 may be isotropically arranged with respect to the plasma generation region 25 so that, when the plasma is generated in the plasma generation region 25, a difference in energy measured by the EUV sensors 44 is small.

The EUV sensors 44 may measure the energy of the EUV light 251 radiated from the plasma in the plasma generation region 25, and transmit the result to the EUV light generation control unit 5.

Operations of the EUV sensors 44 may be controlled by the EUV light generation control unit 5.

The EUV light generation control unit 5 may transmit/receive various signals to/from the exposure device 6.

The EUV light generation control unit 5 may collectively control the operations of components of the EUV light generation system 11 based on the various signals from the exposure device 6.

The EUV light generation control unit 5 may transmit various signals to the laser device 3, and control pulse energy and a pulse width of the pulse laser beam 31.

The EUV light generation control unit 5 may transmit drive signals to the stage 221, the stage 343b, and the stage 352b, and control a traveling direction and an irradiation position of the pulse laser beam 33.

The EUV light generation control unit 5 may transmit various signals to the target supplier 26, and control output of the target 27 from the target supplier 26.

The EUV light generation control unit 5 may set a delay time in the delay circuit 51, and transmit the passage timing signal from the target detector 41 to the delay circuit 51. Thus, the EUV light generation control unit 5 may indirectly control operation timings of the laser device 3, the image sensor 43, and the EUV sensor 44.

The delay circuit 51 may be a circuit configured to adjust the operation timings of the laser device 3, the image sensor 43, and the EUV sensor 44 according to the delay time set by the EUV light generation control unit 5.

The delay time set in the delay circuit 51 may include delay times Dt1 to Dt3 as shown in FIG. 3. The delay times Dt1 to Dt3 may define a timing when the laser device 3 outputs the pulse laser beam 31.

The delay time Dt1 may be a time for adjusting the first irradiation timing so that the primary target is appropriately irradiated with the first prepulse laser beam 31b. The delay time Dt1 may be previously determined so that a timing when the first prepulse laser beam 31b reaches the plasma generation region 25 substantially matches a timing when the target 27 is supplied to the plasma generation region 25.

The delay time Dt2 may be a time for adjusting the second irradiation timing so that the secondary target is appropriately irradiated with the second prepulse laser beam 31c.

The delay time Dt3 may be a time for adjusting the third irradiation timing so that the tertiary target is appropriately irradiated with the main pulse laser beam 31a.

The delay time Dt2 may be a first delay time of the present disclosure. The delay time Dt3 may be a second delay time of the present disclosure.

[3.2 Operation of Comparative Example]

The EUV light generation control unit 5 may set, in the delay circuit 51, set values for adjusting the operation timings of the laser device 3, the image sensor 43, and the EUV sensor 44. The set values set in the delay circuit 51 may include the delay times Dt1 to Dt3.

The EUV light generation control unit 5 may set, in the first prepulse laser device 3b, a set value for controlling at least one of pulse energy and a pulse width of the first prepulse laser beam 31b to be output from the first prepulse laser device 3b.

The EUV light generation control unit 5 may set, in the second prepulse laser device 3c, a set value for controlling at least one of pulse energy and a pulse width of the second prepulse laser beam 31c to be output from the second prepulse laser device 3c.

The EUV light generation control unit 5 may set, in the main pulse laser device 3a, a set value for controlling pulse energy, a pulse width, or a pulse waveform of the main pulse laser beam 31a to be output from the main pulse laser device 3a.

The EUV light generation control unit 5 may control the target supplier 26, and output the target 27 from the target supplier 26 toward the plasma generation region 25.

For example, the EUV light generation control unit 5 may heat the heater 263 included in the target supplier 26 to a temperature equal to or higher than a melting point of the target 27, and melt the solid target 27 housed in the tank 261 included in the target supplier 26.

The EUV light generation control unit 5 may control the pressure adjustor 264 included in the target supplier 26, and apply predetermined pressure to the target 27 in the tank 261 so that the target 27 in the tank 261 is continuously output from the nozzle 262 at a predetermined speed.

The EUV light generation control unit 5 may vibrate the piezoelectric element 265 included in the target supplier 26 with a predetermined waveform, and divide the continuously output target 27 in a predetermined cycle to form the target 27 in the form of droplets, which are output from the nozzle 262 at a predetermined frequency.

The target 27 in the form of droplets output into the chamber 2 can travel on the target trajectory Q and pass through the detection region P.

The illumination unit 411 of the target detector 41 may output illumination light toward the detection region P so as to illuminate the target 27 passing through the detection region P.

The detection unit 412 of the target detector 41 may detect the illumination light output to the detection region P, thereby detecting the target 27 passing through the detection region P. The detection unit 412 may transmit the passage timing signal to the EUV light generation control unit 5.

The EUV light generation control unit 5 may receive the passage timing signal transmitted from the target detector 41, and transmit the passage timing signal to the delay circuit 51. The EUV light generation control unit 5 may transmit the received passage timing signal as it is to the delay circuit 51.

The delay circuit 51 may transmit a first trigger signal to the first prepulse laser device 3b so that the first irradiation timing comes after the delay time Dt1 from the timing when the delay circuit 51 receives the passage timing signal from the EUV light generation control unit 5.

The first trigger signal may be a signal for causing the first prepulse laser device 3b to output the first prepulse laser beam 31b.

Upon receiving the first trigger signal, the first prepulse laser device 3b may output the first prepulse laser beam 31b having at least one of the pulse energy and the pulse width set by the EUV light generation control unit 5.

The first prepulse laser beam 31b output from the first prepulse laser device 3b can be reflected by the mirror 342 and the dichroic mirror 351, and pass through the window 21. The first prepulse laser beam 31b having passed through the window 21 can enter the chamber 2, and be collected with a predetermined spot diameter D1 in the plasma generation region 25 by the laser beam collecting optical system 22a. A primary target, which is the target 27 supplied to the plasma generation region 25, can be irradiated with the first prepulse laser beam 31b collected in the plasma generation region 25 at the first irradiation timing.

As described above, the primary target in the form of droplets can be supplied to the plasma generation region 25. When irradiated with the first prepulse laser beam 31b, the primary target is broken and turned into a secondary target containing fine particles of the target such as microdroplets and clusters scattered in the form of mist. Specifically, the secondary target may be the target 27 turned from the primary target in the form of droplets by being irradiated with the first prepulse laser beam.

The delay circuit 51 may transmit a second trigger signal to the second prepulse laser device 3c so that the second irradiation timing comes after the delay time Dt2 from the first irradiation timing.

The second trigger signal may be a signal for causing the second prepulse laser device 3c to output the second prepulse laser beam 31c.

Upon receiving the second trigger signal, the second prepulse laser device 3c may output the second prepulse laser beam 31c having at least one of the pulse energy and the pulse width set by the EUV light generation control unit 5.

The second prepulse laser beam 31c output from the second prepulse laser device 3c can be reflected by the first mirror optical system 343 so as to have substantially the same optical path axis as the first prepulse laser beam 31b reflected by the mirror 342. The second prepulse laser beam 31c reflected by the first mirror optical system 343 can pass through the mirror 342, and be reflected by the dichroic mirror 351 with substantially the same optical path axis as the first prepulse laser beam 31b. The second prepulse laser beam 31c reflected by the dichroic mirror 351 can pass through the window 21 with substantially the same optical path axis as the first prepulse laser beam 31b. The second prepulse laser beam 31c having passed through the window can enter the chamber 2, and be collected with a predetermined spot diameter D2 in the plasma generation region 25 by the laser beam collecting optical system 22a. The secondary target, which is the primary target having been irradiated with the first prepulse laser beam 31b, can be irradiated with the second prepulse laser beam 31c collected in the plasma generation region 25 at the second irradiation timing.

When irradiated with the second prepulse laser beam 31c, the secondary target can be turned into a tertiary target containing much finer particles of the target 27 and vapor of the target 27. The tertiary target may contain preplasma that is a part of the target 27 turned into plasma. The preplasma may be the target 27 such that a part of the secondary target is turned into plasma to contain ions or neutral particles. Specifically, the tertiary target may be the target 27 turned from the secondary target in the form of mist by being irradiated with the second prepulse laser beam 31c.

The delay circuit 51 may transmit a third trigger signal to the main pulse laser device 3a so that the third irradiation timing comes after the delay time Dt3 from the first irradiation timing.

The third trigger signal may be a signal for causing the main pulse laser device 3a to output the main pulse laser beam 31a.

Upon receiving the third trigger signal, the main pulse laser device 3a may output the main pulse laser beam 31a having at least one of the pulse energy, the pulse width, and the pulse waveform set by the EUV light generation control unit 5.

The main pulse laser beam 31a output from the main pulse laser device 3a can be reflected by the high reflection mirror 341. The main pulse laser beam 31a reflected by the high reflection mirror 341 can be reflected by the second mirror optical system 352 so as to have substantially the same optical path axis as the first and second prepulse laser beams 31b and 31c reflected by the dichroic mirror 351. The main pulse laser beam 31a reflected by the second mirror optical system 352 can pass through the dichroic mirror 351, and pass through the window 21 with substantially the same optical path axis as the first and second prepulse laser beams 31b and 31c. The main pulse laser beam 31a having passed through the window 21 can enter the chamber 2, and be collected with a predetermined spot diameter Dm in the plasma generation region 25 by the laser beam collecting optical system 22a. The tertiary target, which is the secondary target having been irradiated with the second prepulse laser beam 31c, can be irradiated with the main pulse laser beam 31a collected in the plasma generation region 25 at the third irradiation timing.

When irradiated with the main pulse laser beam 31a, the tertiary target can be turned into plasma, and radiate light containing the EUV light 251. The EUV light 251 having a wavelength around a particular wavelength in the EUV light 251 radiated from the plasma can be selectively reflected by the EUV collecting mirror 23. The selectively reflected EUV light 251 can be collected as EUV light 252 on the intermediate collecting point 292, and output to the exposure device 6.

Irradiating the tertiary target with the main pulse laser beam 31a can increase generation efficiency of the EUV light 251 by the main pulse laser beam 31a as compared to irradiating the primary or secondary target with the main pulse laser beam 31a.

The delay circuit 51 may transmit a first gate signal to the EUV sensors 44 so that the energy of the EUV light 251 radiated from the plasma is appropriately measured.

The first gate signal may be a signal for causing the EUV sensors 44 to measure the energy of the EUV light 251.

For example, the delay circuit 51 may transmit the first gate signal to the EUV sensors 44 so that a measurement timing of the EUV sensors 44 comes between the third irradiation timing and the subsequent first irradiation timing.

Upon receiving the first gate signal, the EUV sensors 44 may measure the energy of the EUV light 251 radiated from the plasma, and transmit measurement values to the EUV light generation control unit 5.

The EUV light generation control unit 5 may store an average value of the plurality of measurement values transmitted from the EUV sensors 44 as a measurement result of the EUV sensors 44.

The delay circuit 51 may transmit a second gate signal having a predetermined time width to the image sensor 43 so that an image of the primary target is appropriately obtained.

The second gate signal may be a signal for causing the image sensor 43 to be exposed to light and obtain an image of around the plasma generation region 25. The second gate signal may be a signal for causing the image sensor 43 to be exposed to light for its time width and obtain an image.

For example, the delay circuit 51 may transmit the second gate signal to the image sensor 43 so that the image sensor 43 receives the second gate signal between the timing when the delay circuit 51 receives the passage timing signal from the EUV light generation control unit 5 and the first irradiation timing.

Similarly, the delay circuit 51 may transmit the second gate signal to the image sensor 43 so that an image of the secondary target is appropriately obtained. For example, the delay circuit 51 may transmit the second gate signal to the image sensor 43 so that the image sensor 43 starts receiving the second gate signal after the first irradiation timing and finishes receiving the second gate signal before the second irradiation timing.

The delay circuit 51 may transmit the second gate signal to the image sensor 43 so that an image of the tertiary target is appropriately obtained. For example, the delay circuit 51 may transmit the second gate signal to the image sensor 43 so that the image sensor 43 starts receiving the second gate signal after the second irradiation timing and finishes receiving the second gate signal before the third irradiation timing.

The delay circuit 51 may transmit the second gate signal to the image sensor 43 so that an image of the plasma is appropriately obtained. For example, the delay circuit 51 may transmit the second gate signal to the image sensor 43 so that the image sensor 43 starts receiving the second gate signal after the third irradiation timing and finishes receiving the second gate signal before the subsequent first irradiation timing.

Upon receiving the second gate signal, the image sensor 43 may obtain the images of the primary to tertiary targets and the plasma. The image sensor 43 may transmit those images of the primary to tertiary targets and the plasma to the EUV light generation control unit 5.

The EUV light generation control unit 5 may analyze at least one of the obtained images of the primary to tertiary targets and the plasma, and correct the set value set in the delay circuit 51 based on an analysis result.

For example, the EUV light generation control unit 5 may analyze the image of the secondary target, and correct a set value relating to a transmission timing of the second gate signal and the delay times Dt1 to Dt3 so that the secondary target scattered in a predetermined size is arranged in a predetermined position in the image.

The EUV light generation control unit 5 may reset the corrected set value in the delay circuit 51.

[3.3 Problems]

The EUV light generation device 1 of the comparative example is previously designed so that the first and second prepulse laser beams 31b and 31c and the main pulse laser beam 31a have substantially the same optical path axis and are each collected in the plasma generation region 25. Thus, immediately after the manufacture of the EUV light generation device 1, the primary to tertiary targets can be irradiated with the first and second prepulse laser beams 31b and 31c and the main pulse laser beam 31a, respectively, in proper irradiation positions.

In other words, immediately after the manufacture of the EUV light generation device 1, the irradiation position of the pulse laser beam 33 can substantially match the irradiation position at the time of design. The irradiation position at the time of design can be, for example, a position determined with reference to a standard irradiation condition of the pulse laser beam 33.

In contrast, after maintenance of the EUV light generation device 1, the irradiation position of the pulse laser beam 33 may need to be adjusted. This may be because there is a machine difference between components replaced during maintenance, and also there is a difference in alignment of components between at the time of design and after maintenance. If the irradiation position of the pulse laser beam 33 shifts, a large amount of debris, which is the target 27 that does not contribute to generation of the EUV light 251, may be produced, thereby reducing the generation efficiency of the EUV light 251.

In particular, adjustment of the irradiation positions of the second prepulse laser beam 31b and the main pulse laser beam 31a may be important. This may be because the second prepulse laser beam 31b and the main pulse laser beam 31a may sometimes have lower tolerance for the shift of the irradiation position in the plasma generation region 25 as compared to the first prepulse laser beam 31b. Specifically, an irradiation diameter of the first prepulse laser beam 31b in the plasma generation region 25 may be set to be sufficiently larger than a diameter of the primary target. On the other hand, irradiation diameters of the second prepulse laser beam 31c and the main pulse laser beam 31a in the plasma generation region 25 may be set to be equal to or slightly larger than diameters of the secondary and tertiary targets, respectively. Thus, the shift of the irradiation positions of the second prepulse laser beam 31b and the main pulse laser beam 31a from the irradiation positions at the time of design may have a large influence on production of debris and a reduction in generation efficiency of the EUV light 251, and have a large influence on reduction in output of the EUV light 252. Therefore, the second prepulse laser beam 31b and the main pulse laser beam 31a may sometimes have lower tolerance for the shift of the irradiation position as compared to the first prepulse laser beam 31b.

If the irradiation position of the pulse laser beam 33 is adjusted, the delay times Dt1 to Dt3 that define transmission timings of the first to third trigger signals may need to be adjusted.

Under such circumstances, when the EUV light generation device 1 of the comparative example is used to adjust the irradiation position of the pulse laser beam 33, a skilled operator has adjusted alignment of components based on measurement results of the image sensor 43, the EUV sensor 44, and the like.

Thus, when the EUV light generation device 1 of the comparative example is used to adjust the irradiation position of the pulse laser beam 33, adjustment procedure and adjustment accuracy may differ depending on operators. In addition, the number of processes required for the adjustment may increase.

Thus, a technology is desired capable of adjusting the irradiation condition of the pulse laser beam 33 with high accuracy, high reproducibility, and a small number of processes while reducing debris to ensure the generation efficiency of the EUV light 251.

[4. First Embodiment]

With reference to FIGS. 2 to 12, an EUV light generation device 1 of a first embodiment will be described.

The EUV light generation device 1 of the first embodiment may have a function of automatically adjusting an irradiation position and an irradiation timing of a pulse laser beam 33.

Descriptions on configurations and operations of the EUV light generation device 1 of the first embodiment similar to those of the EUV light generation device 1 of the comparative example will be omitted.

[4.1 Configuration]

The EUV light generation device 1 of the first embodiment may include an irradiation position adjustment unit 7 and an irradiation timing adjustment unit 8.

The irradiation position adjustment unit 7 may serve to adjust at least one of irradiation positions of a plurality of pulse lasers with which a target 27 is irradiated in a plasma generation region 25. The irradiation position adjustment unit 7 may serve to adjust at least irradiation positions of a second prepulse laser beam 31b and a main pulse laser beam 31a.

The irradiation position adjustment unit 7 may include a laser beam collecting optical system 22a, a first mirror optical system 343, and a second mirror optical system 352 shown in FIG. 2.

An operation of the irradiation position adjustment unit 7 may be controlled by an EUV light generation control unit 5.

The irradiation timing adjustment unit 8 may serve to adjust at least one of irradiation timings of the plurality of pulse lasers with which the target 27 is irradiated in the plasma generation region 25. The irradiation timing adjustment unit 8 may serve to adjust at least irradiation timings of the second prepulse laser beam 31b and the main pulse laser beam 31a.

The irradiation timing adjustment unit 8 may include a delay circuit 51 shown in FIG. 2.

An operation of the irradiation timing adjustment unit 8 may be controlled by the EUV light generation control unit 5.

The irradiation timing adjustment unit 8 may be constituted by software included in the EUV light generation control unit 5. In this case, an information processing with the software that constitutes the irradiation timing adjustment unit 8 may be specifically achieved using hardware resources.

The EUV light generation control unit 5 may control the irradiation position adjustment unit 7 and the irradiation timing adjustment unit 8 based on a measurement result of an EUV sensor 44.

The EUV light generation control unit 5 may control the irradiation position adjustment unit 7 and the irradiation timing adjustment unit 8 based on the measurement result of the EUV sensor 44 after occurrence of a predetermined event.

The predetermined event may be at least one of maintenance of the EUV light generation device 1 and an event in which an output of the EUV light generation device 1 falls below a desired value.

The maintenance of the EUV light generation device 1 may be, for example, replacement of a chamber 2, replacement of an EUV collecting mirror 23, replacement of a target supplier 26, replacement of a laser beam traveling direction control unit 34, replacement of a laser propagation system, or the like.

Other configurations of the EUV light generation device 1 of the first embodiment may be similar to those of the EUV light generation device 1 of the comparative example.

[4.2 Operation]

An operation of the EUV light generation device 1 of the first embodiment will be described. Specifically, a processing will be described, which is performed by the EUV light generation control unit 5 according to the first embodiment for adjusting an irradiation position and an irradiation timing of a pulse laser beam 33.

FIG. 4 is a flowchart of adjustment processings of the irradiation position and the irradiation timing of the pulse laser beam 33.

The processings in FIG. 4 may be performed by the EUV light generation control unit 5 according to the first embodiment after the occurrence of the predetermined event described above such as the maintenance of the EUV light generation device 1.

In step S1, the EUV light generation control unit 5 may set an initial condition.

Setting of the initial condition may include setting of an output condition of the pulse laser beam 33, spot diameters D (D1, D2, Dm), and scattering speeds of secondary and tertiary targets.

The spot diameter D1 may be an irradiation diameter of the first prepulse laser beam 31b in the plasma generation region 25.

The spot diameter D2 may be an irradiation diameter of a second prepulse laser beam 31c in the plasma generation region 25.

The spot diameter Dm may be an irradiation diameter of the main pulse laser beam 31a in the plasma generation region 25.

Thus, the wording "spot diameter" herein does not necessarily mean a beam diameter at a beam waist. An irradiation diameter of the pulse laser beam 33 may be defined as a beam diameter of the pulse laser beam 33 traveling toward the plasma generation region 25, on a plane substantially perpendicular to a traveling direction of the pulse laser beam 33 and intersecting the plasma generation region 25.

The scattering speeds of the secondary and tertiary targets may be previously determined based on an image obtained by an image sensor 43.

Further, setting of the initial condition may include setting of allowable values R (Rm, R2, Rf) of adjustment amounts of the irradiation position adjustment unit 7.

The adjustment amounts of the irradiation position adjustment unit 7 may be adjustment amounts of the laser beam collecting optical system 22a, the first mirror optical system 343, and the second mirror optical system 352.

The allowable value Rm may be an allowable value of the adjustment amount of the second mirror optical system 352. Specifically, the allowable value Rm may be an allowable value of an adjustment amount of a stage 352b included in the second mirror optical system 352. The allowable value Rm may correspond to an allowable value of an adjustment amount of an irradiation position of the main pulse laser beam 31a.

The allowable value R2 may be an allowable value of the adjustment amount of the first mirror optical system 343. Specifically, the allowable value R2 may be an allowable value of an adjustment amount of a stage 343b included in the first mirror optical system 343. The allowable value R2 may correspond to an allowable value of an adjustment amount of an irradiation position of the second prepulse laser beam 31c.

The allowable value Rf may be an allowable value of the adjustment amount of the laser beam collecting optical system 22a. Specifically, the allowable value Rf may be an allowable value of an adjustment amount of a stage 221 included in the laser beam collecting optical system 22a.

The allowable value R may range from (D/8) to (D/2). Preferably, the allowable values Rm and R2 may be (D/3). Preferably, the allowable value Rf may be (D/4).

Further, setting of the initial condition may include setting of allowable values T (Ttd, Tt3) of adjustment amounts of the irradiation timing adjustment unit 8.

The adjustment amounts of the irradiation timing adjustment unit 8 may be adjustment amounts relating to delay times Dt2 and Dt3 set in the delay circuit 51.

In the EUV light generation device 1 of the first embodiment, the irradiation timing adjustment unit 8 may actually adjust a difference time Dtd and the delay time Dt3. As shown in FIG. 3, the difference time Dtd may be a difference between the delay time Dt3 and the delay time Dt2. Adjusting the difference time Dtd may be substantially the same as adjusting the delay time Dt2. Specifically, in the EUV light generation device 1 of the first embodiment, the adjustment amounts of the irradiation timing adjustment unit 8 may be substantially adjustment amounts of the difference time Dtd and the delay time Dt3.

The allowable value Ttd may be an allowable value of the adjustment amount of the difference time Dtd. The allowable value Ttd may correspond to an allowable value of an adjustment amount of a second irradiation timing.

The allowable value Tt3 may be an allowable value of the adjustment amount of the delay time Dt3. The allowable value Tt3 may correspond to an allowable value of an adjustment amount of a third irradiation timing.

The allowable value Ttd may range from 100 ns to 300 ns. Preferably, the allowable value Ttd may be 100 ns.

The allowable value Tt3 may range from 200 ns to 700 ns. Preferably, the allowable value Tt3 may be 500 ns.

The delay time Dt1 can be determined using a distance from a detection region P to the plasma generation region 25, a traveling speed of a primary target, and a time between a transmission timing of a first trigger signal and a timing when the first prepulse laser beam 31b reaches the plasma generation region 25.

Thus, when controlling the irradiation timing adjustment unit 8, the EUV light generation control unit according to the first embodiment may set the previously determined delay time Dt1 in the delay circuit as adjustment of the first irradiation timing. Specifically, the EUV light generation control unit 5 according to the first embodiment does not have to adjust the delay time Dt1.

Further, setting of the initial condition may include setting of parameters S1 (Sm, S2, Sf) of the irradiation position adjustment unit 7 before adjustment.

The parameters S1 (Sm, S2, Sf) of the irradiation position adjustment unit 7 may be parameters relating to the irradiation position of the pulse laser beam 33 in the plasma generation region 25, and may be expressed using coordinates on an XY plane intersecting the plasma generation region 25. The XY plane may be a plane substantially perpendicular to the traveling direction of the pulse laser beam 33 traveling toward the plasma generation region 25. In other words, the XY plane may be a plane substantially parallel to a beam section of the pulse laser beam 33 traveling toward the plasma generation region 25.

For example, an irradiation position Sm of the main pulse laser beam 31a may be expressed as Sm (1x, 1y) using coordinates on the XY plane intersecting the plasma generation region 25.

An irradiation position S2 of the second prepulse laser beam 31c may be expressed as S2 (4x, 4y) using coordinates on the XY plane intersecting the plasma generation region 25.

A position Sf of the laser beam collecting optical system 22a may be an irradiation position of the pulse laser beam 33 applied by the laser beam collecting optical system 22a. The position Sf of the laser beam collecting optical system 22a may be expressed as Sf (fx, fy) using coordinates on the XY plane intersecting the plasma generation region 25.

Alternatively, the parameters S1 (Sm, S2, Sf) of the irradiation position adjustment unit 7 may be expressed as the irradiation position of the pulse laser beam 33 using positions and attitudes of the second mirror optical system 352, the first mirror optical system 343, and the laser beam collecting optical system 22a.

For example, the irradiation position Sm of the main pulse laser beam 31a may be expressed as Sm (r1, θ1) using a position and an angle of a high reflection mirror 352a included in the second mirror optical system 352.

The irradiation position S2 of the second prepulse laser beam 31c may be expressed as S2 (r4, θ4) using a position and an angle of a high reflection mirror 343a included in the first mirror optical system 343.

The position Sf of the laser beam collecting optical system 22a may be expressed as Sf (xf, yf) using a position of a laser beam collecting mirror 22 included in the laser beam collecting optical system 22a.

Further, setting of the initial condition may include setting of parameters Dt (Dtd, Dt3) of the irradiation timing adjustment unit 8 before adjustment.

The parameters Dt (Dtd, Dt3) of the irradiation timing adjustment unit 8 may be parameters indicating the difference time Dtd and the delay time Dt3.

The difference time Dtd and the delay time Dt3 before adjustment may be values previously determined based on an experiment or a design, or values set in the delay circuit 51 before maintenance.

In step S2, the EUV light generation control unit 5 may perform an irradiation position adjustment processing.

The irradiation position adjustment processing may be a processing for controlling the irradiation position adjustment unit 7 to adjust the irradiation position of the pulse laser beam 33.

Specifically, the EUV light generation control unit 5 may control the second mirror optical system 352 in the irradiation position adjustment unit 7 to adjust the irradiation position Sm of the main pulse laser beam 31a.

The irradiation position adjustment processing will be described later with reference to FIG. 5.

In step S3, the EUV light generation control unit 5 may perform an irradiation position adjustment processing.

Specifically, the EUV light generation control unit 5 may control the first mirror optical system 343 in the irradiation position adjustment unit 7 to adjust the irradiation position S2 of the second prepulse laser beam 31c.

The irradiation position adjustment processing will be described later with reference to FIG. 5.

In step S4, the EUV light generation control unit 5 may perform an irradiation position adjustment processing.

Specifically, the EUV light generation control unit 5 may control the laser beam collecting optical system 22a in the irradiation position adjustment unit 7 to adjust the position Sf of the laser beam collecting optical system 22a.

The irradiation position adjustment processing will be described later with reference to FIG. 5.

When the processings in step S2 to S4 are performed, the parameters S1 (Sm, S2, Sf) of the irradiation position adjustment unit 7 before adjustment can be adjusted to parameters S1' (Sm', S2', Sf') of the irradiation position adjustment unit 7 after adjustment. In this case, the parameters S1' (Sm', S2', Sf') of the irradiation position adjustment unit 7 can be adjusted in the order of Sm', S2', and Sf'.

Specifically, the EUV light generation control unit 5 may control the second mirror optical system 352, the first mirror optical system 343, and the laser beam collecting optical system 22a in this order to adjust the irradiation position of the pulse laser beam 33.

The EUV light generation control unit 5 can perform adjustment in this order, and thus can start adjustment from the irradiation position of the pulse laser beam 33 having a large influence on production of debris and a reduction in generation efficiency of EUV light 251. The main pulse laser beam 31a often has a larger influence on the production of debris and reduction in generation efficiency of the EUV light 251 than the second prepulse laser beam 31c.

In steps S5 to S7, the EUV light generation control unit 5 may perform processings similar to those in step S2 to S4.

In step S8, the EUV light generation control unit 5 may determine whether or not the adjustment amount of the laser beam collecting optical system 22a is equal to the allowable value Rf or less.

The EUV light generation control unit 5 may take, as the adjustment amount of the laser beam collecting optical system 22a, an absolute value |Sf'−Sf| of a difference between a position Sf' of the laser beam collecting optical system 22a after adjustment and the position Sf of the laser beam collecting optical system 22a before adjustment.

If the adjustment amount of the laser beam collecting optical system 22a exceeds the allowable value Rf, the EUV light generation control unit 5 may move to step S2. On the other hand, if the adjustment amount of the laser beam collecting optical system 22a is equal to the allowable value Rf or less, the EUV light generation control unit 5 may move to step S9.

In step S9, the EUV light generation control unit 5 may perform an irradiation timing adjustment processing.

The irradiation timing adjustment processing may be a processing for controlling the irradiation timing adjustment unit 8 to adjust the irradiation timing of the pulse laser beam 33.

Specifically, the EUV light generation control unit 5 may adjust the difference time Dtd and the delay time Dt3 and set the delay times Dt2 and Dt3 in the delay circuit 51. The EUV light generation control unit 5 may set the previously determined delay time Dt1 in the delay circuit 51.

The irradiation timing adjustment processing will be described later with reference to FIG. 9.

When the processing in step S9 is performed, the parameters Dt (Dtd, Dt3) of the irradiation timing adjustment unit 8 before adjustment can be adjusted to parameters Dt' (Dtd', Dt3') of the irradiation timing adjustment unit 8 after adjustment. Then, the delay times Dt2 and Dt3 according to the parameters Dt' of the irradiation timing adjustment unit 8 after adjustment and the delay time Dt1 previously determined as described above can be set in the delay circuit 51.

In step S10, the EUV light generation control unit 5 may determine whether or not the adjustment amounts of the irradiation timing adjustment unit 8 are equal to the allowable values T or less.

The EUV light generation control unit 5 may take, as an adjustment amount of the difference time Dtd, an absolute value |Dtd'−Dtd| of a difference between the difference time Dtd' after adjustment and the difference time Dtd before adjustment.

The EUV light generation control unit 5 may take, as an adjustment amount of the delay time Dt3, an absolute value |Dt3'−Dt3| of a difference between the delay time Dt3' after adjustment and the delay time Dt3 before adjustment.

If the adjustment amount of the difference time Dtd exceeds the allowable value Ttd or the adjustment amount of the delay time Dt3 exceeds the allowable value Tt3, the EUV light generation control unit 5 may move to step S2. On the other hand, if the adjustment amount of the difference time Dtd is equal to the allowable value Ttd or less and the adjustment amount of the delay time Dt3 is equal to the allowable value Tt3 or less, the EUV light generation control unit 5 may finish this processing.

With reference to FIGS. 5 to 8, the irradiation position adjustment processing will be described.

FIG. 5 is a flowchart of the irradiation position adjustment processings in steps S2 to S7 in FIG. 4. FIG. 6 illustrates a scan level group in the irradiation position adjustment processing in FIG. 5. FIG. 7 illustrates a distribution chart of energy of the EUV light 251 created based on the scan level group in FIG. 6. FIG. 8 illustrates an approximate curve obtained from the distribution chart in FIG. 7.

The irradiation position adjustment processings in steps S2 to S4 in FIG. 4 control the second mirror optical system 352, the first mirror optical system 343, and the laser beam collecting optical system 22*a*. These processings may be expressed using substantially the same algorithm.

The processings in steps S5 to S7 are similar to those in steps S2 to S4, and thus can be expressed using substantially the same algorithm as that of steps S2 to S4.

Specifically, the irradiation position adjustment processings in steps S2 to S7 in FIG. 4 can be expressed using substantially the same algorithm.

Thus, in FIGS. 5 to 8, the irradiation position adjustment processing in step S2 in FIG. 4 will be described as a representative.

In step S11, the EUV light generation control unit 5 may read the scan level group.

When adjusting the irradiation position of the pulse laser beam 33, the EUV light generation control unit 5 may control the irradiation position adjustment unit 7 so that the irradiation position of the pulse laser beam 33 is scanned on the XY plane intersecting the plasma generation region 25. The EUV light generation control unit 5 may obtain a measurement result of the EUV sensor 44 for each scan.

Rayleigh lengths of the first and second prepulse laser beams 31*b* and 31*c* and the main pulse laser beam 31*a* in the plasma generation region 25 may be 100 μm to 1000 μm. Thus, even if the irradiation position of the pulse laser beam 33 is scanned in a Z-axis direction, obtained measurement results may have small variations between scans. In other words, even if the irradiation position of the pulse laser beam 33 is adjusted in the Z-axis direction, it may sometimes have little contribution to prevent the production of debris and reduction in generation efficiency of the EUV light 251. Thus, the EUV light generation control unit 5 may cause the irradiation position adjustment unit 7 to scan the irradiation position of the pulse laser beam 33 on the XY plane intersecting the plasma generation region 25.

Specifically, the EUV light generation control unit 5 may scan, for example, the irradiation position Sm (1x, 1y) of the main pulse laser beam 31*a* based on the scan level group as illustrated in FIG. 6. Arrows in FIG. 6 illustrate an order of progression of scan levels. As illustrated in FIG. 6, the scan level group may be created using a table arranged in a matrix around the irradiation position Sm (1x, 1y) of the main pulse laser beam 31*a* before adjustment. Alternatively, the scan level group may be created using a table arranged in a cross around the irradiation position Sm (1x, 1y) of the main pulse laser beam 31*a* before adjustment if ellipticity of a profile of the main pulse laser beam 31*a* is equal to a predetermined value or less.

The EUV light generation control unit 5 may previously hold a plurality of scan level groups, and read the scan level groups according to the output condition and the spot diameters D of the pulse laser beam 33. Alternatively, the EUV light generation control unit 5 may create a scan level group according to the output condition and the spot diameters D of the pulse laser beam 33.

In step S12, the EUV light generation control unit 5 may drive the stage 352*b* of the second mirror optical system 352 so that the irradiation position Sm (1x, 1y) of the main pulse laser beam 31*a* is scanned based on the read scan level group.

For scanning the irradiation positions S2 and Sf, the EUV light generation control unit 5 may drive the stage 343*b* of the first mirror optical system 343 and the stage 221 of the laser beam collecting optical system 22*a*.

In step S13, the EUV light generation control unit 5 may transmit the first to third trigger signals to the laser device 3 to generate the EUV light 251.

In this case, the delay times Dt2 and Dt3 set in the delay circuit 51 may be the delay times Dt2 and Dt3 according to the difference time Dtd and the delay time Dt3 before adjustment.

In step S14, the EUV light generation control unit 5 may obtain a measurement result of the EUV sensor 44.

The EUV light generation control unit 5 may perform a statistical processing of a plurality of measurement values transmitted from the plurality of EUV sensors 44, and obtain the energy of the EUV light 251 and/or its variations. The energy of the EUV light 251 may be of an average value of the plurality of measurement values transmitted from the EUV sensors 44. The variations in the energy of the EUV light 251 may be, for example, 3σ.

The EUV light generation control unit 5 may obtain the energy of the EUV light 251 and/or its variations as the measurement result of the EUV sensor 44, and store them in association with each scan level.

In order to obtain a measurement result of the EUV sensor 44 for one scan level, the EUV light generation control unit 5 may generate EUV light 251 with 100 to 100,000 pulses. An operation condition of the EUV light generation device 1 when generating the EUV light 251 of 100,000 pulses may be such that a duty cycle is 50%, the number of pulses of the EUV light 251 for one burst is 10,000, and an operation is performed for 10 bursts. The burst may be an operation of the EUV light generation device 1 such that the EUV light 251 is generated at a predetermined repetition frequency during a predetermined time. The duty cycle may be a ratio of the predetermined time when the EUV light 251 is generated at the predetermined repetition frequency to a unit time.

In step S15, the EUV light generation control unit 5 may determine whether or not scan at all scan levels included in the read scan level group has been performed.

If scan at all the scan levels has not been performed, the EUV light generation control unit 5 may move to step S12. On the other hand, if scan at all the scan levels has been performed, the EUV light generation control unit 5 may move to step S16.

In step S16, the EUV light generation control unit 5 may create a distribution chart of the energy of the EUV light 251 as illustrated in FIG. 7 based on the measurement result of the EUV sensor 44 stored in association with each scan level.

In step S17, the EUV light generation control unit 5 may determine and store an optimum position for the irradiation position Sm (1x, 1y) of the main pulse laser beam 31*a* based on the created distribution chart of the energy of the EUV light 251.

For example, the EUV light generation control unit 5 may determine, as an optimum position Sm' (1x', 1y'), the irradiation position Sm (1x, 1y) at a scan level with maximum energy of the EUV light 251 in the created distribution chart.

Alternatively, the EUV light generation control unit 5 may determine the optimum position Sm' (1x', 1y') by numerical analysis using data in the created distribution chart.

For example, as illustrated in FIG. 8, the EUV light generation control unit 5 may identify, as analysis objects, the scan level with the maximum energy of the EUV light 251 and scan levels therearound, and the energy of the EUV light 251 associated with the scan levels.

As illustrated in FIG. 8, the EUV light generation control unit 5 may approximate energy distribution of the EUV light 251 to a Gaussian distribution curve or a quadratic curve using, for example, a least squares method. Then, the EUV light generation control unit 5 may determine, as an optimum position Sm' (1x', 1y'), an X coordinate and a Y coordinate corresponding to a maximum value of an approximate curve.

The EUV light generation control unit 5 may set the determined optimum position Sm' (1x', 1y') to the parameter S1' of the irradiation position adjustment unit 7.

If optimum positions S2' and Sf' for the irradiation positions S2 and Sf have not been determined in this stage, the irradiation positions S2 and Sf before adjustment may be set to the parameter S1'.

Specifically, after the processing in step S2 in FIG. 2, the parameter S1' may be set to S1' (Sm', S2, Sf). After the processing in step S3 in FIG. 2, the parameter S1' may be set to S1' (Sm', S2', Sf). After the processing in step S4 in FIG. 2, the parameter S1' may be set to S1' (Sm', S2', Sf').

In step S18, the EUV light generation control unit 5 may control the irradiation position adjustment unit 7 according to the optimum position.

Specifically, the EUV light generation control unit 5 may drive the stage 352b, the stage 343b, and the stage 221 according to the parameter S1' to which the optimum position is set.

Thus, the irradiation position Sm of the main pulse laser beam 31a can be adjusted to the optimum position Sm'.

In step S19, the EUV light generation control unit 5 may determine whether or not the adjustment amount of the second mirror optical system 352 is equal to the allowable value Rm or less.

The EUV light generation control unit 5 may take, as the adjustment amount of the second mirror optical system 352, an absolute value |Sm'−Sm| of a difference between the irradiation position Sm' of the main pulse laser beam 31a after adjustment and the irradiation position Sm of the main pulse laser beam 31a before adjustment.

If the adjustment amount of the second mirror optical system 352 is equal to the allowable value Rm or less, the EUV light generation control unit 5 may finish this processing and move to step S3 in FIG. 4. On the other hand, if the adjustment amount of the second mirror optical system 352 exceeds the allowable value Rm, the EUV light generation control unit 5 may move to step S20.

When determining whether or not the adjustment amount of the first mirror optical system 343 is equal to the allowable value R2 or less and when determining whether or not the adjustment amount of the laser beam collecting optical system 22a is the allowable value Rf or less, the EUV light generation control unit 5 may perform a processing similar to that in step S19.

In step S20, the EUV light generation control unit 5 may update the current scan level group to a scan level group centered at the optimum position Sm', and move to step S11.

With reference to FIGS. 9 to 12, the irradiation timing adjustment processing will be described.

FIG. 9 is a flowchart of the irradiation timing adjustment processing in step S9 in FIG. 4. FIG. 10 illustrates a scan level group in the irradiation timing adjustment processing in FIG. 9. FIG. 11 illustrates a second table created based on the scan level group in FIG. 10. FIG. 12 illustrates a first table created based on the scan level group in FIG. 10.

In step S21, the EUV light generation control unit 5 may read the scan level group.

When adjusting the irradiation timing of the pulse laser beam 33, the EUV light generation control unit 5 may scan the difference time Dtd and the delay time Dt3, and obtain a measurement result of the EUV sensor 44 for each scan.

The EUV light generation control unit 5 may scan the difference time Dtd and the delay time Dt3 based on the scan level group as illustrated in FIG. 10. Arrows in FIG. 10 illustrate an order of progression of the scan levels. As illustrated in FIG. 10, the scan level group may be created using a table in a matrix form.

The EUV light generation control unit 5 may previously hold a plurality of scan level groups, and read the scan level groups according to the output condition of the pulse laser beam 33 and the scattering speeds of the secondary and tertiary targets. Alternatively, the EUV light generation control unit 5 may create a scan level group according to the output condition of the pulse laser beam 33 and the scattering speeds of the secondary and tertiary targets.

In step S22, the EUV light generation control unit 5 may scan the difference time Dtd and the delay time Dt3 based on the read scan level group. Then, the EUV light generation control unit 5 may set the delay times Dt2 and Dt3 according to the scanned difference time Dtd and delay time Dt3 in the delay circuit 51. The EUV light generation control unit 5 may set the previously determined delay time Dt1 in the delay circuit 51.

In step S23, the EUV light generation control unit 5 may transmit the first to third trigger signals to the laser device 3 to generate the EUV light 251.

In this case, the irradiation position S1 of the pulse laser beam 33 may have been adjusted to the optimum position S1'.

In step S24, the EUV light generation control unit 5 may obtain a measurement result of the EUV sensor 44 similarly to step S14 in FIG. 5.

Specifically, the EUV light generation control unit 5 may perform a statistical processing of a plurality of measurement values transmitted from the plurality of EUV sensors 44, and obtain the energy of the EUV light 251 and its variations. The energy of the EUV light 251 may be an average of the plurality of measurement values transmitted from the EUV sensors 44. The variations in the energy of the EUV light 251 may be, for example, $3\sigma$.

The EUV light generation control unit 5 may obtain the energy of the EUV light 251 and its variations as the measurement result of the EUV sensor 44, and store them in association with each scan level.

In step S25, the EUV light generation control unit 5 may determine whether or not scan at all scan levels included in the read scan level group has been performed similarly to step S15 in FIG. 5.

If scan at all the scan levels has not been performed, the EUV light generation control unit 5 may move to step S22.

On the other hand, if scan at all the scan levels has been performed, the EUV light generation control unit 5 may move to step S26.

In step S26, the EUV light generation control unit 5 may create a second table as illustrated in FIG. 11 and a first table as illustrated in FIG. 12 based on the measurement result of the EUV sensor 44 stored in association with each scan level.

As illustrated in FIG. 12, the first table may be a table showing correspondence of the energy of the EUV light 251 to the difference time Dtd and the delay time Dt3.

As illustrated in FIG. 11, the second table may be a table showing correspondence of the variations in the energy of the EUV light 251 to the difference time Dtd and the delay time Dt3.

In step S27, the EUV light generation control unit 5 may determine and store optimum times for the difference time Dtd and the delay time Dt3 based on the created first and second tables.

The EUV light generation control unit 5 may identify a plurality of scan levels at which the variations in the energy of the EUV light 251 are within a predetermined range in the created second table.

As illustrated in FIG. 11, the predetermined range may be a range in which the variations in the energy of the EUV light 251 are in the top 10%. The predetermined range may be a range in which the variations in the energy of the EUV light 251 are equal to a predetermined value or less.

Further, the EUV light generation control unit 5 may determine, as optimum times Dt' (Dtd', Dt3'), the difference time Dtd and the delay time Dt3 at the scan level with maximum energy of the EUV light 251 in the first table among the plurality of scan levels identified in the second table.

The EUV light generation control unit 5 may set the determined optimum times Dt' (Dtd', Dt3') to a parameter Dt' of the irradiation timing adjustment unit 8.

In step S28, the EUV light generation control unit 5 may control the irradiation timing adjustment unit 8 according to the optimum times Dt' (Dtd', Dt3').

Specifically, the EUV light generation control unit 5 may set the delay times Dt2' and Dt3' according to the optimum times Dt' (Dtd', Dt3') in the delay circuit 51. The delay time Dt2' may be obtained by subtracting Dtd' from Dt3'. The EUV light generation control unit 5 may set the previously determined delay time Dt1 in the delay circuit 51.

Then, the EUV light generation control unit 5 may finish this processing and move to step S10 in FIG. 4.

Other operations of the EUV light generation device 1 of the first embodiment may be similar to those of the EUV light generation device 1 of the comparative example.

[4.3 Operation and Effect]

The EUV light generation device 1 of the first embodiment can automatically adjust the irradiation position and the irradiation timing of the pulse laser beam 33 under control by the EUV light generation control unit 5 after occurrence of the predetermined event such as maintenance described above. In this case, after the adjustment processing of the irradiation position of the pulse laser beam 33, the adjustment processing of the irradiation timing of the pulse laser beam 33 is performed. The adjustment processing of the irradiation position of the pulse laser beam 33 can be expressed using substantially the same algorithm as that for creating the distribution chart. The adjustment processing of the irradiation timing of the pulse laser beam 33 can be also expressed using substantially the same algorithm as that for the adjustment processing of the irradiation position in terms of creating the table instead of the distribution chart.

Specifically, the EUV light generation device 1 of the first embodiment can automatically adjust the irradiation position and the irradiation timing of the pulse laser beam 33 by creating the distribution chart and the table.

Thus, the EUV light generation device 1 of the first embodiment can achieve adjustment of the irradiation position and the irradiation timing of the pulse laser beam 33 with high accuracy, high reproducibility, and a small number of processes.

As a result, the EUV light generation device 1 of the first embodiment can adjust the irradiation condition of the pulse laser beam 33 with high accuracy, high reproducibility, and a small number of processes while reducing debris to ensure generation efficiency of the EUV light 251.

[4.4 Variant]

FIG. 13 illustrates an EUV light generation control unit 5 according to a variant of the first embodiment, and illustrates the first table created based on the scan level group in FIG. 10. FIG. 14 illustrates the EUV light generation control unit 5 according to the variant of the first embodiment, and illustrates the second table created based on the scan level group in FIG. 10.

In step S27 in FIG. 9, the EUV light generation control unit 5 according to the variant of the first embodiment may determine optimum times for a difference time Dtd and a delay time Dt3 in a manner different from that in the first embodiment.

Specifically, in the variant of the first embodiment, the EUV light generation control unit 5 may identify a plurality of scan levels at which the energy of the EUV light 251 is within a predetermined range in the created first table.

As illustrated in FIG. 13, the predetermined range may be a range in which the energy of the EUV light 251 is in the top 10%. The predetermined range may be a range in which the energy of the EUV light 251 is equal to a predetermined value or higher.

Further, the EUV light generation control unit 5 may determine, as optimum times Dt' (Dtd', Dt3'), a difference time Dtd and a delay time Dt3 at a scan level with minimum variations in the energy of the EUV light 251 in the second table among the plurality of scan levels identified in the first table.

The EUV light generation control unit 5 may set the determined optimum times Dt' (Dtd', Dt3') to a parameter Dt' of the irradiation timing adjustment unit 8.

[5. Second Embodiment]

With reference to FIGS. 15 to 18, an EUV light generation device 1 of a second embodiment will be described.

A configuration of the EUV light generation device 1 of the second embodiment may be similar to that of the EUV light generation device 1 of the first embodiment.

An operation of the EUV light generation device 1 of the second embodiment may be different from that of the EUV light generation device 1 of the first embodiment.

Specifically, the EUV light generation control unit according to the second embodiment may scan an irradiation position of a pulse laser beam 33 in a manner different from that in the first embodiment in an irradiation position adjustment processing. More specifically, the EUV light generation control unit 5 according to the second embodiment may scan the irradiation position of the pulse laser beam 33 alternately in an X-axis direction and a Y-axis direction. For example, the EUV light generation control unit 5 according to the second embodiment may scan in the X-axis direction and then in the Y-axis direction on an XY plane intersecting a plasma generation region 25.

Descriptions on configurations and operations of the EUV light generation device 1 of the second embodiment similar to those of the EUV light generation device 1 of the first embodiment will be omitted.

[5.1 Operation]

With reference to FIGS. 15 to 18, the irradiation position adjustment processing according to the second embodiment will be described.

FIG. 15 is a flowchart of the irradiation position adjustment processing according to the second embodiment.

The EUV light generation control unit 5 according to the second embodiment may perform irradiation position adjustment processings in FIG. 15 replacing the irradiation position adjustment processings in steps S2 to S7 in FIG. 4.

The irradiation position adjustment processings in FIG. 15 replacing the irradiation position adjustment processings in steps S2 to S7 in FIG. 4 can be expressed using substantially the same algorithm.

Thus, in FIGS. 15 to 18, the irradiation position adjustment processing in FIG. 15 replacing the processing in step S2 in FIG. 4 will be described as a representative.

In step S31, the EUV light generation control unit 5 may read initial absolute positions Xi and Yi, relative position levels Xk and Yk, and target energy Et of EUV light 251 according to an output condition and a spot diameter D of the pulse laser beam 33.

The initial absolute positions Xi and Yi may be absolute coordinates of an initial position at an irradiation position of a main pulse laser beam 31a.

The relative position levels Xk and Yk may indicate relative coordinates from absolute positions Xi' and Yi' of a scan level as a base of scan. The irradiation position of the main pulse laser beam 31a may be scanned based on the relative position levels Xk and Yk with the absolute positions Xi' and Yi' as the base.

The value k may be an argument relating to the relative position levels Xk and Yk. The value k may be a natural number from 1 to n. The value n may be the number of possible scan levels for the relative position levels Xk and Yk.

In step S32, the EUV light generation control unit 5 may set the read initial absolute positions Xi and Yi to the absolute positions Xi' and Yi' of the scan level as the base of scan as shown by the following expressions:

Xi'=Xi

Yi'=Yi

In step S33, the EUV light generation control unit 5 may perform loop 1 for repeating processings in steps S34 to S38 until a value of the relative position level Xk reaches Xn as shown by the following expression. Thus, the EUV light generation control unit 5 may scan the irradiation position of the main pulse laser beam 31a in the X-axis direction with the absolute positions Xi' and Yi' as the base.

while Xk≠Xn (k=1 to n)

In step S34, the EUV light generation control unit 5 may determine whether or not a measurement result of an EUV sensor 44 has been obtained at a scan level with an absolute position of (Xi'+Xk).

If the measurement result of the EUV sensor 44 has not been obtained at the scan level with the absolute position of (Xi'+Xk), the EUV light generation control unit 5 may move to step S36. On the other hand, if the measurement result of the EUV sensor 44 has been obtained at the scan level with the absolute position of (Xi'+Xk), the EUV light generation control unit 5 may move to step S35.

In step S35, the EUV light generation control unit 5 may increment the argument k as shown by the following expression:

k=k+1

Then, the EUV light generation control unit 5 may move to step S34.

In step S36, the EUV light generation control unit 5 may drive a stage 352b of a second mirror optical system 352 so that the irradiation position of the main pulse laser beam 31a is the absolute position (Xi'+Xk).

In step S37, similarly to step S13 in FIG. 5, the EUV light generation control unit 5 may transmit first to third trigger signals to a laser device 3 to generate the EUV light 251.

In step S38, the EUV light generation control unit 5 may obtain a measurement result of the EUV sensor 44 similarly to step S14 in FIG. 5.

The EUV light generation control unit 5 may obtain the energy of the EUV light 251 and/or its variations as the measurement result of the EUV sensor 44, and store them in association with each scan level. In this case, the EUV light generation control unit 5 may store the measured energy of the EUV light 251 as Ek.

When loop 1 for repeating the processings in steps S34 to S38 is performed, the irradiation position of the main pulse laser beam 31a can be scanned based on scan level groups with absolute positions of (Xi'+X1), (Xi'+X2), . . . , and (Xi'+Xn). Then, the energy Ek of the EUV light 251 is stored in association with each scan level.

In step S39, the EUV light generation control unit 5 may identify a scan level with maximum energy Ek of the EUV light 251 in the scan level group at which scan has been performed in loop 1.

In step S40, the EUV light generation control unit 5 may drive the stage 352b of the second mirror optical system 352 so that the irradiation position of the main pulse laser beam 31a is the absolute position (Xi'+Xk) of the scan level identified in step S39.

In step S41, the EUV light generation control unit 5 may set the absolute position (Xi'+Xk) of the scan level identified in step S39 to the absolute position Xi' of the scan level as the base of scan as shown by the following expression:

Xi'=Xi'+Xk

In step S42, the EUV light generation control unit 5 may determine whether or not the maximum energy Ek associated with the scan level identified in step S39 is equal to the target energy Et or higher as shown by the following expression:

Ek≤Et

If the maximum energy Ek is equal to the target energy Et or higher, the EUV light generation control unit 5 may finish this processing. On the other hand, if the maximum energy Ek is lower than the target energy Et, the EUV light generation control unit 5 may move to step S43.

In step S43, the EUV light generation control unit 5 may perform loop 2 for repeating processings in steps S44 to S48 until a value of the relative position level Yk reaches Yn as shown by the following expression. Thus, the EUV light generation control unit 5 may scan the irradiation position of the main pulse laser beam 31a in the Y-axis direction with the absolute positions Xi' and Yi' as the base.

while Yk # Yn
(k=1 to n)

In step S44, the EUV light generation control unit 5 may determine whether or not a measurement result of the EUV sensor 44 has been obtained at a scan level with an absolute position of (Yi'+Yk).

If the measurement result of the EUV sensor 44 has not been obtained at the scan level with the absolute position of (Yi'+Yk), the EUV light generation control unit 5 may move to step S46. On the other hand, if the measurement result of the EUV sensor 44 has been obtained at the scan level with the absolute position of (Yi'+Yk), the EUV light generation control unit 5 may move to step S45.

In step S45, the EUV light generation control unit 5 may increment the argument k as shown by the following expression:

$$k=k+1$$

Then, the EUV light generation control unit 5 may move to step S44.

In step S46, the EUV light generation control unit 5 may drive the stage 352b of the second mirror optical system 352 so that the irradiation position of the main pulse laser beam 31a is the absolute position (Yi'+Yk).

In step S47, similarly to step S13 in FIG. 5, the EUV light generation control unit 5 may transmit the first to third trigger signals to the laser device 3 to generate the EUV light 251.

In step S48, similarly to step S14 in FIG. 5, the EUV light generation control unit 5 may obtain a measurement result of the EUV sensor 44.

The EUV light generation control unit 5 may obtain the energy of the EUV light 251 and/or its variations as the measurement result of the EUV sensor 44, and store them in association with each scan level. In this case, the EUV light generation control unit 5 may store the measured energy of the EUV light 251 as Ek.

In step S49, the EUV light generation control unit 5 may identify a scan level with maximum energy Ek of the EUV light 251 in the scan level group at which scan has been performed in loop 2.

In step S50, the EUV light generation control unit 5 may drive the stage 352b of the second mirror optical system 352 so that the irradiation position of the main pulse laser beam 31a is the absolute position (Yi'+Yk) of the scan level identified in step S49.

In step S51, the EUV light generation control unit 5 may set the absolute position (Yi'+Yk) of the scan level identified in step S49 to the absolute position Yi' of the scan level as the base of scan as shown by the following expression:

$$Yi'=Yi'+Yk$$

In step S52, the EUV light generation control unit 5 may determine whether or not the maximum energy Ek associated with the scan level identified in step S49 is equal to the target energy Et or higher as shown by the following expression:

$$Ek \leq Et$$

If the maximum energy Ek is equal to the target energy Et or higher, the EUV light generation control unit 5 may finish this processing. On the other hand, if the maximum energy Ek is lower than the target energy Et, the EUV light generation control unit 5 may move to step S33.

With reference to FIGS. 16 to 18, an overview of the irradiation position adjustment processing in FIG. 15 will be described with a specific example.

FIG. 16 illustrates the overview of the irradiation position adjustment processing in FIG. 15, and illustrates a distribution chart of the energy of the EUV light 251.

The scan levels shown in the distribution chart in FIG. 16 are expressed by absolute coordinates on the XY plane intersecting the plasma generation region 25.

Here, the number n of scan levels for the relative position levels Xk and Yk is 3. Specifically, the argument k may be 1, 2, or 3.

The relative position levels Xk and Yk are the following values:

X1=−10, X2=0, X3=+10
Y1=−10, Y2=0, Y3=+10

The initial absolute positions Xi and Yi are the following values:

Xi=0, Yi=0

The target energy Et of the EUV light 251 is 9.50 mJ.

FIG. 17 illustrates the overview of the irradiation position adjustment processing in FIG. 15, and illustrates an order of progression of scan levels. FIG. 18 illustrates the overview of the irradiation position adjustment processing in FIG. 15, and illustrates energy associated with the scan levels at which scan has been performed in the order shown in FIG. 17.

Numbers 1 to 6 assigned to the scan levels in FIG. 17 indicate the order of progression of the scan levels.

If the irradiation position adjustment processing in FIG. 15 is performed without the distribution chart illustrated in FIG. 16 being known by the EUV light generation control unit 5, scan may be performed in the following order of progression of the scan levels as illustrated in FIG. 17.

As shown in steps S34 and S44 in FIG. 15, the scan level at which the measurement result of the EUV sensor has been obtained is skipped. Thus, the order of progression of the scan levels may be numbers 1 to 6 as illustrated in FIG. 17.

First, with a scan level in initial absolute positions Xi=0 and Yi=0 as a base, scan in the X-axis direction is performed as shown by an arrow A. In the scan in the direction of the arrow A, the energy of the EUV light 251 corresponding to a third scan level in the order of progression is higher than the energy of the EUV light 251 corresponding to other scan levels but lower than the target energy Et.

Thus, with the third scan level in the order of progression as a base, scan in the Y-axis direction is performed as shown by an arrow B. In the scan in the direction of the arrow B, the energy of the EUV light 251 corresponding to the third scan level in the order of progression is higher than the energy of the EUV light 251 corresponding to other scan levels but lower than the target energy Et.

Thus, with the third scan level in the order of progression as the base, scan in the X-axis direction is performed as shown by an arrow C. In the scan in the direction of the arrow C, the energy Ek of the EUV light 251 corresponding to a sixth scan level in the order of progression is higher than the energy of the EUV light 251 corresponding to other scan levels. In addition, the energy Ek of the EUV light 251 corresponding to the sixth scan level in the order of progression is equal to the target energy Et or higher.

Thus, the irradiation position adjustment processing in FIG. 15 can be finished. By the irradiation position adjustment processing in this specific example, a distribution chart of the energy of the EUV light 251 illustrated in FIG. 18 can be created by the EUV light generation control unit 5.

[5.2 Operation and Effect]

The EUV light generation control unit 5 according to the second embodiment can perform scan in one of the X-axis direction and the Y-axis direction in the irradiation position adjustment processing, and finish the irradiation position adjustment processing if there is energy equal to or higher than the target energy Et in energy associated with each scan level at which scan has been performed.

On the other hand, the EUV light generation control unit 5 according to the first embodiment can perform scan at all the scan levels included in the read scan level group in the irradiation position adjustment processing.

Thus, the EUV light generation device 1 of the second embodiment can reduce the number of processes required for adjusting the irradiation position of the pulse laser beam 33 as compared to the first embodiment.

[6. Third Embodiment]

With reference to FIGS. 19 to 21, an EUV light generation device 1 of a third embodiment will be described.

The EUV light generation device 1 of the third embodiment may adjust an irradiation position and an irradiation timing of a pulse laser beam 33 based on generation efficiency of EUV light 251.

The EUV light generation device 1 of the third embodiment may include a beam splitter 344 instead of the high reflection mirror 341 in the EUV light generation device 1 of the first embodiment. Further, the EUV light generation device 1 of the third embodiment may include a laser sensor 45 in addition to the configuration of the EUV light generation device 1 of the first embodiment.

Descriptions on configurations and operations of the EUV light generation device 1 of the third embodiment similar to those of the EUV light generation device 1 of the first embodiment will be omitted.

[6.1 Configuration]

FIG. 19 illustrates the configuration of the EUV light generation device of the third embodiment.

The beam splitter 344 may be arranged on an optical path of a main pulse laser beam 31a output from a main pulse laser device 3a and between the main pulse laser device 3a and a beam combiner 35.

The beam splitter 344 may reflect a part of the main pulse laser beam 31a output from the main pulse laser device 3a toward the beam combiner 35, and pass therethrough another part of the main pulse laser beam 31a toward the laser sensor 45.

The laser sensor 45 may be a sensor configured to measure energy of the main pulse laser beam 31a.

The laser sensor 45 may be arranged on an optical path of the main pulse laser beam 31a having passed through the beam splitter 344.

The laser sensor 45 may measure the energy of the main pulse laser beam 31a having passed through the beam splitter 344, and transmit a measurement value to an EUV light generation control unit 5.

An operation of the laser sensor 45 may be controlled by the EUV light generation control unit 5.

A delay circuit 51 according to the third embodiment may adjust an operation timing of the laser sensor 45.

The delay circuit 51 may transmit a third gate signal to the laser sensor 45 so that the energy of the main pulse laser beam 31a is appropriately measured.

The third gate signal may be a signal for causing the laser sensor 45 to measure the energy of the main pulse laser beam 31a.

For example, the delay circuit 51 may transmit the third gate signal in synchronization with a transmission timing of a third trigger signal.

Other configurations of the EUV light generation device 1 of the third embodiment may be similar to those of the EUV light generation device 1 of the first embodiment.

[6.2 Operation]

With reference to FIGS. 20 and 21, the operation of the EUV light generation device 1 of the third embodiment will be described.

FIG. 20 is a flowchart of the irradiation position adjustment processing according to the third embodiment.

The EUV light generation control unit 5 according to the third embodiment may perform irradiation position adjustment processings in FIG. 20 replacing the irradiation position adjustment processings in steps S2 to S7 in FIG. 4.

The irradiation position adjustment processings in FIG. 20 replacing the irradiation position adjustment processings in steps S2 to S7 in FIG. 4 can be expressed using substantially the same algorithm.

Thus, in FIG. 20, the irradiation position adjustment processing in FIG. 20 replacing the processing in step S2 in FIG. 4 will be described as a representative.

In steps S61 to S64, the EUV light generation control unit 5 may perform processings similar to those in steps S11 to S14 in FIG. 5.

In step S65, the EUV light generation control unit 5 may obtain a measurement result of the laser sensor 45. Then, the EUV light generation control unit 5 may calculate generation efficiency of the EUV light 251.

The EUV light generation control unit 5 may obtain the energy of the main pulse laser beam 31a measured by the laser sensor 45 as the measurement result of the laser sensor 45.

The generation efficiency of the EUV light 251 may be a value of a ratio of the energy of the EUV light 251 to the energy of the main pulse laser beam 31a expressed in percentage.

The EUV light generation control unit 5 may use the energy of the EUV light 251 as the measurement result of the EUV sensor 44 and the energy of the main pulse laser beam 31a as the measurement result of the laser sensor 45 to calculate the generation efficiency of the EUV light 251 and/or its variations.

The EUV light generation control unit 5 may store the calculated generation efficiency of the EUV light 251 and/or its variations in association with each scan level.

In step S66, similarly to step S15 in FIG. 5, the EUV light generation control unit 5 may determine whether or not scan at all scan levels included in a read scan level group has been performed.

If scan at all the scan levels has not been performed, the EUV light generation control unit 5 may move to step S62. On the other hand, if scan at all the scan levels has been performed, the EUV light generation control unit 5 may move to step S67.

In step S67, similarly to step S16 in FIG. 5, the EUV light generation control unit 5 may create a distribution chart of the generation efficiency of the EUV light 251 based on the generation efficiency of the EUV light 251 stored in association with each scan level.

The distribution chart of the generation efficiency of the EUV light 251 may be similar to the distribution chart illustrated in FIG. 7, with the energy of the EUV light 251 associated with each scan level being replaced by the generation efficiency.

In step S68, the EUV light generation control unit 5 may determine and store an optimum position for an irradiation position Sm (1x, 1y) of the main pulse laser beam 31a based on the created distribution chart of the generation efficiency of the EUV light 251.

Similarly to step S17 in FIG. 5, the EUV light generation control unit 5 may determine, as an optimum position Sm'

(1x', 1y'), the irradiation position Sm (1x, 1y) at a scan level with maximum generation efficiency of the EUV light 251 in the created distribution chart.

Alternatively, similarly to step S17 in FIG. 5, the EUV light generation control unit 5 may determine the optimum position Sm' (1x', 1y') by a numerical analysis using data in the created distribution chart.

Then, the EUV light generation control unit 5 may set the determined optimum position Sm' (1x', 1y') to a parameter S' of the irradiation position adjustment unit 7.

In step S69, the EUV light generation control unit 5 may perform a processing similar to that in step S18 in FIG. 5.

In step S70, similarly to step S19 in FIG. 5, the EUV light generation control unit 5 may determine whether or not an adjustment amount of a second mirror optical system 352 is equal to an allowable value Rm or less.

If the adjustment amount of the second mirror optical system 352 is equal to the allowable value Rm or less, the EUV light generation control unit 5 may finish this processing and move to step S3 in FIG. 4. On the other hand, if the adjustment amount of the second mirror optical system 352 exceeds the allowable value Rm, the EUV light generation control unit 5 may move to step S71.

In step S71, similarly to step S20 in FIG. 5, the EUV light generation control unit 5 may update the current scan level group to a scan level group centered at the optimum position Sm', and move to step S61.

FIG. 21 is a flowchart of the irradiation timing adjustment processing according to the third embodiment.

The EUV light generation control unit 5 according to the third embodiment may perform an irradiation timing adjustment processing in FIG. 21 replacing the irradiation timing adjustment processing in step S9 in FIG. 4.

In steps S81 to S84, the EUV light generation control unit 5 may perform processings similar to those in steps S21 to S24 in FIG. 9.

In step S85, similarly to step S65 in FIG. 20, the EUV light generation control unit 5 may obtain a measurement result of the laser sensor 45, and calculate the generation efficiency of the EUV light 251 and its variations.

The EUV light generation control unit 5 may store the calculated generation efficiency of the EUV light 251 and its variations in association with each scan level.

In step S86, similarly to step S25 in FIG. 9, the EUV light generation control unit 5 may determine whether or not scan at all scan levels included in a read scan level group has been performed.

If scan at all the scan levels has not been performed, the EUV light generation control unit 5 may move to step S82. On the other hand, if scan at all the scan levels has been performed, the EUV light generation control unit 5 may move to step S87.

In step S87, similarly to step S26 in FIG. 9, the EUV light generation control unit 5 may create a third table and a fourth table based on the generation efficiency of the EUV light 251 and its variations stored in association with each scan level.

The third table may be a table similar to that in FIG. 12 showing correspondence of the generation efficiency of the EUV light 251 to a difference time Dtd and a delay time Dt3.

The fourth table may be a table similar to that in FIG. 11 showing correspondence of the variations in the generation efficiency of the EUV light 251 to the difference time Dtd and the delay time Dt3.

In step S88, similarly to step S27 in FIG. 9, the EUV light generation control unit 5 may determine and store optimum times for the difference time Dtd and the delay time Dt3 based on the created third and fourth tables.

The EUV light generation control unit 5 may identify a plurality of scan levels at which the variations in the generation efficiency of the EUV light 251 are within a predetermined range in the created fourth table.

Similarly to FIG. 11, the predetermined range may be a range in which the variations in the generation efficiency of the EUV light 251 are in the top 10%. The predetermined range may be a range in which the variations in the generation efficiency of the EUV light 251 are equal to a predetermined value or less.

Further, the EUV light generation control unit 5 may determine, as optimum times Dt' (Dtd', Dt3'), the difference time Dtd and the delay time Dt3 at the scan level with maximum generation efficiency of the EUV light 251 in the third table among the plurality of scan levels identified by the fourth table.

The EUV light generation control unit 5 may set the determined optimum times Dt' (Dtd', Dt3') to a parameter Dt' of the irradiation timing adjustment unit 8.

In step S89, the EUV light generation control unit 5 may perform a processing similar to that in step S28 in FIG. 9.

Then, the EUV light generation control unit 5 may finish this processing and move to step S10 in FIG. 4.

Other operations of the EUV light generation device 1 of the third embodiment may be similar to those of the EUV light generation device 1 of the first embodiment.

[6.3 Operation and effect]

The EUV light generation device 1 of the third embodiment can adjust the irradiation position and the irradiation timing of the pulse laser beam 33 based on the generation efficiency of the EUV light 251.

Thus, the EUV light generation device 1 of the third embodiment can directly adjust the irradiation position and the irradiation timing of the pulse laser beam 33 to an irradiation position and an irradiation timing optimum for ensuring the generation efficiency of the EUV light 251.

As a result, the EUV light generation device 1 of the third embodiment can more appropriately adjust an irradiation condition of the pulse laser beam 33 than the EUV light generation device 1 according to the first embodiment.

[7. Fourth Embodiment]

With reference to FIGS. 22 and 23, an EUV light generation device 1 of a fourth embodiment will be described.

In the EUV light generation device 1 of the fourth embodiment, an EUV light generation control unit 5 may scan an irradiation position of a main pulse laser beam 31a based on a measurement result of a pointing sensor 46.

The EUV light generation device 1 of the fourth embodiment may have a configuration in which the pointing sensor 46 is added to and the high reflection mirror 341 is omitted from the configuration of the EUV light generation device 1 of the first embodiment. Further, the EUV light generation device 1 of the fourth embodiment may include a second mirror optical system 352 and a beam combiner 35 having configurations different from those in the EUV light generation device 1 of the first embodiment.

Descriptions on configurations and operations of the EUV light generation device 1 of the fourth embodiment similar to those of the EUV light generation device 1 of the first embodiment will be omitted.

[7.1 Configuration]

FIG. 22 illustrates a configuration of the EUV light generation device 1 of the fourth embodiment.

The second mirror optical system 352 according to the fourth embodiment may be arranged in a position similar to the position of the high reflection mirror 341 according to the first embodiment rather than being included in the beam combiner 35.

Specifically, the second mirror optical system 352 may be arranged on an optical path of a main pulse laser beam 31a output from a main pulse laser device 3a and between the main pulse laser device 3a and the beam combiner 35.

A high reflection mirror 352a of the second mirror optical system 352 may reflect the main pulse laser beam 31a output from the main pulse laser device 3a toward the beam combiner 35.

The beam combiner 35 according to the fourth embodiment may include a dichroic mirror 351 and a beam splitter 353.

The beam splitter 353 may be arranged on an optical path of the main pulse laser beam 31a reflected by the second mirror optical system 352 and between the second mirror optical system 352 and the dichroic mirror 351.

The beam splitter 353 may reflect a part of the main pulse laser beam 31a reflected by the second mirror optical system 352 toward the dichroic mirror 351, and pass therethrough another part of the main pulse laser beam 31a toward the pointing sensor 46.

The dichroic mirror 351 may be arranged on an optical path of the main pulse laser beam 31a reflected by the beam splitter 353 and between the beam splitter 353 and a window 21.

The dichroic mirror 351 may pass therethrough the main pulse laser beam 31a reflected by the beam splitter 353 toward the window 21.

The pointing sensor 46 may be a sensor configured to measure pointing of the main pulse laser beam 31a.

The pointing sensor 46 may be arranged on an optical path of the main pulse laser beam 31a having passed through the beam splitter 353.

The main pulse laser beam 31a having passed through the beam splitter 353 may enter a light receiving surface of the pointing sensor 46. The pointing sensor 46 may measure an incident position of the main pulse laser beam 31a on the light receiving surface to measure pointing of the main pulse laser beam 31a. The pointing sensor 46 may transmit a measurement result to the EUV light generation control unit 5.

An operation of the pointing sensor 46 may be controlled by the EUV light generation control unit 5.

Other configurations of the EUV light generation device 1 of the fourth embodiment may be similar to those of the EUV light generation device 1 of the first embodiment.

[7.2 Operation]

FIG. 23 is a flowchart of an irradiation position adjustment processing according to the fourth embodiment.

For the EUV light generation control unit 5 according to the fourth embodiment, irradiation position adjustment processings in steps S3 and S6 and S4 and S7 in FIG. 4 may be similar to those in the first embodiment.

The EUV light generation control unit 5 according to the fourth embodiment may perform irradiation position adjustment processings in FIG. 23 replacing the irradiation position adjustment processings in steps S2 and S5 in FIG. 4.

In step S91, the EUV light generation control unit 5 may perform a processing similar to that in step S11 in FIG. 5.

In step S92, the EUV light generation control unit 5 may change a control target value of the second mirror optical system 352.

As described above, the pointing sensor 46 can measure the incident position of the main pulse laser beam 31a on the light receiving surface, and transmit a measurement result to the EUV light generation control unit 5.

The EUV light generation control unit 5 according to the fourth embodiment may control the second mirror optical system 352 so that an irradiation position of the main pulse laser beam 31a is scanned based on a measurement result of the pointing sensor 46.

Specifically, the EUV light generation control unit according to the fourth embodiment may estimate the irradiation position of the main pulse laser beam 31a on an XY plane intersecting a plasma generation region 25 from the incident position of the main pulse laser beam 31a on the light receiving surface of the pointing sensor 46.

The EUV light generation control unit 5 may drive a stage 352b of the second mirror optical system 352 so that the estimated irradiation position of the main pulse laser beam 31a is scanned in conformity to each scan level of a read scan level group.

The control target value of the second mirror optical system 352 may be a value obtained by converting the position of each scan level included in the read scan level group into a position and an attitude of the high reflection mirror 352a of the second mirror optical system 352.

In step S93, the EUV light generation control unit 5 may drive the stage 352b of the second mirror optical system 352 according to the control target value of the second mirror optical system 352.

The EUV light generation control unit 5 may drive the stage 352b of the second mirror optical system 352 so that the position and the attitude of the high reflection mirror 352a of the second mirror optical system 352 are adjusted to the changed control target value of the second mirror optical system 352.

In steps S94 and S95, the EUV light generation control unit 5 may perform processings similar to those in steps S13 and S14 in FIG. 5.

In step S96, the EUV light generation control unit 5 may obtain a measurement result of the pointing sensor 46. Then, the EUV light generation control unit 5 may store the obtained measurement result of the pointing sensor 46 in association with each scan level.

In step S97, similarly to step S15 in FIG. 5, the EUV light generation control unit 5 may determine whether or not scan at all scan levels included in a read scan level group has been performed.

If scan at all the scan levels has not been performed, the EUV light generation control unit 5 may move to step S92. On the other hand, if scan at all the scan levels has been performed, the EUV light generation control unit 5 may move to step S98.

In step S98, similarly to step S16 in FIG. 5, the EUV light generation control unit 5 may create a distribution chart of energy of EUV light 251 based on the energy of the EUV light 251 stored in association with each scan level.

The distribution chart of the energy of the EUV light 251 may be similar to the distribution chart illustrated in FIG. 7.

In steps S99 and S100, the EUV light generation control unit 5 may perform processings similar to those in steps S17 and S18 in FIG. 5.

In step S101, the EUV light generation control unit may update the control target value of the second mirror optical system to a value according to an optimum position Sm'.

In step S102, similarly to step S19 in FIG. 5, the EUV light generation control unit 5 may determine whether or not an adjustment amount of the second mirror optical system 352 is equal to an allowable value Rm or less.

If the adjustment amount of the second mirror optical system 352 is equal to the allowable value Rm or less, the EUV light generation control unit 5 may finish this processing and move to step S3 in FIG. 4. On the other hand, if the adjustment amount of the second mirror optical system 352 exceeds the allowable value Rm, the EUV light generation control unit 5 may move to step S103.

In step S103, similarly to step S20 in FIG. 5, the EUV light generation control unit 5 may update the current scan level group to a scan level group centered at an optimum position Sm', and move to step S91.

Other operations of the EUV light generation device 1 of the fourth embodiment may be similar to those of the EUV light generation device 1 of the first embodiment.

[7.3 Operation and Effect]

The EUV light generation device 1 of the fourth embodiment can automatically adjust the irradiation position of the main pulse laser beam 31a similarly to the first embodiment even if the irradiation position of the main pulse laser beam 31a is scanned based on the measurement result of the pointing sensor 46.

The EUV light generation device 1 of the fourth embodiment can also automatically adjust an irradiation position of a second prepulse laser beam 31c and an irradiation timing of a pulse laser beam 33 similarly to the first embodiment.

Therefore, the EUV light generation device 1 of the fourth embodiment can adjust an irradiation condition of the pulse laser beam 33 with high accuracy, high reproducibility, and a small number of processes while reducing debris to ensure generation efficiency of the EUV light 251.

[8. Others]

[8.1 Hardware Environment of Control Units]

Those skilled in the art will understand that the subject matter described herein is performed using a general-purpose computer or a programmable controller in combination with a program module or a software application. Typically, the program module includes routines, programs, components, data structures, or the like capable of performing the processes described in the present disclosure.

FIG. 24 is a block diagram of an exemplary hardware environment in which various aspects of the disclosed subject matter can be performed. The exemplary hardware environment 100 in FIG. 24 may include a processing unit 1000, a storage unit 1005, a user interface 1010, a parallel I/O controller 1020, a serial I/O controller 1030, and an A/D and D/A converter 1040, but a configuration of the hardware environment 100 is not limited to this.

The processing unit 1000 may include a central processing unit (CPU) 1001, a memory 1002, a timer 1003, and an image processing unit (GPU) 1004. The memory 1002 may include a random-access memory (RAM) and a read-only memory (ROM). The CPU 1001 may be any of commercially available processors. A dual microprocessor or other multiprocessor architectures may be used as the CPU 1001.

Such structures in FIG. 24 may be mutually connected to perform the processes described in the present disclosure.

In operation, the processing unit 1000 may read and execute a program stored in the storage unit 1005. The processing unit 1000 may read data together with the program from the storage unit 1005. The processing unit 1000 may write data in the storage unit 1005. The CPU 1001 may execute the program read from the storage unit 1005. The memory 1002 may be a workspace for temporarily storing the program executed by the CPU 1001 and data used for the operation of the CPU 1001. The timer 1003 may measure a time interval and output a measurement result to the CPU 1001 according to the execution of the program.

The GPU 1004 may process image data according to the program read from the storage unit 1005, and output a processing result to the CPU 1001.

The parallel I/O controller 1020 may be connected to parallel I/O devices communicable with the processing unit 1000, such as the EUV light generation control unit 5 and the delay circuit 51, and may control communication between the processing unit 1000 and the parallel I/O devices. The serial I/O controller 1030 may be connected to serial I/O devices communicable with the processing unit 1000, such as the stage 221, the heater 263, the pressure adjustor 264, the laser beam traveling direction control unit 34, the first mirror optical system 343, the stage 343b, the second mirror optical system 352, the stage 352b, the illumination unit 411, and the image sensor 43, and may control communication between the processing unit 1000 and the serial I/O devices. The A/D and D/A converter 1040 may be connected via analog ports to analog devices such as the piezoelectric element 265, the target sensor 4, the detection unit 412, the EUV sensor 44, the laser sensor 45, and the pointing sensor 46, and may control communication between the processing unit 1000 and the analog devices or perform A/D or D/A conversion of communication contents.

The user interface 1010 may display progress of the program executed by the processing unit 1000 to an operator so that the operator can instruct the processing unit 1000 to stop the program or execute an interruption routine.

The exemplary hardware environment 100 may be applied to the configuration of the EUV light generation control unit 5 or the like in the present disclosure. Those skilled in the art will understand that the controllers may be achieved in a distributed computing environment, that is, an environment in which a task is executed by processing units connected via a communication network. In the present disclosure, the EUV light generation control unit 5 and other components may be mutually connected via a communication network such as the Ethernet or the Internet. In the distributed computing environment, the program module may be stored in both local and remote memory storage devices.

[8.2 Other Variants Etc.]

It will be apparent to those skilled in the art that the technologies in the embodiments described above including the variants may be compatible with each other.

The above descriptions are intended to be illustrative only and not restrictive. Thus, it will be apparent to those skilled in the art that modifications may be made in the embodiments in the present disclosure without departing from the scope of the appended claims.

The terms used throughout the specification and the appended claims should be interpreted as "non-limiting." For example, the term "comprising" or "comprised" should be interpreted as "including the described elements but not limited thereto." The term "having" should be interpreted as "having the described elements but not limited thereto". Further, the modifier "a/an" described in the specification and the appended claims should be interpreted to mean "at least one" or "one or more".

What is claimed is:

1. An extreme ultraviolet light generation device comprising:
   an EUV sensor configured to measure energy of extreme ultraviolet light generated when a target is irradiated with a plurality of laser beams in a predetermined region in a chamber;

an irradiation position adjustment unit configured to adjust at least one of irradiation positions of the laser beams with which the target is irradiated in the predetermined region;

an irradiation timing adjustment unit configured to adjust at least one of irradiation timings of the laser beams with which the target is irradiated in the predetermined region; and a control unit configured to control the irradiation position adjustment unit and the irradiation timing adjustment unit, the control unit controlling the irradiation position adjustment unit and then controlling the irradiation timing adjustment unit based on a measurement result of the EUV sensor, wherein the control unit controls the irradiation position adjustment unit so that the irradiation position is scanned on a plane that is substantially perpendicular to a traveling direction of the laser beams traveling toward the predetermined region and that intersects the predetermined region.

2. The extreme ultraviolet light generation device according to claim 1, wherein the control unit controls the irradiation position adjustment unit so that the irradiation position is scanned along one of two axes on the plane, and then the irradiation position is scanned along the other of the axes.

3. The extreme ultraviolet light generation device according to claim 1, wherein the laser beams include:
   a first prepulse laser beam with which a primary target is irradiated at a first irradiation timing, the primary target being the target having been supplied to the predetermined region;
   a second prepulse laser beam with which a secondary target is irradiated at a second irradiation timing, the secondary target being the primary target having been irradiated with the first prepulse laser beam, and
   a main pulse laser beam with which a tertiary target is irradiated at a third irradiation timing, the tertiary target being the secondary target having been irradiated with the second prepulse laser beam.

4. The extreme ultraviolet light generation device according to claim 3, wherein the irradiation position adjustment unit includes:
   a collecting optical system configured to collect the first and second prepulse laser beams and the main pulse laser beam in the predetermined region;
   a first mirror optical system arranged on an optical path of the second prepulse laser beam before entering the collecting optical system, and configured to adjust the irradiation position of the second prepulse laser beam on the secondary target; and
   a second mirror optical system arranged on an optical path of the main pulse laser beam before entering the collecting optical system, and configured to adjust the irradiation position of the main pulse laser beam on the tertiary target, and
   the control unit controls the second mirror optical system, the first mirror optical system, and the collecting optical system in this order.

5. The extreme ultraviolet light generation device according to claim 4, further comprising a pointing sensor configured to measure pointing of the main pulse laser beam, wherein the control unit controls the second mirror optical system so that the irradiation position of the main pulse laser beam is scanned based on a measurement result of the pointing sensor.

6. The extreme ultraviolet light generation device according to claim 4, wherein the irradiation timing adjustment unit includes a delay circuit configured to
   adjust the first irradiation timing to a timing when the primary target is supplied to the predetermined region,
   adjust the second irradiation timing by adding a first delay time to the first irradiation timing, and
   adjust the third irradiation timing by adding a second delay time to the first irradiation timing, and
   the control unit sets the first and second delay times in the delay circuit when controlling the irradiation timing adjustment unit.

7. The extreme ultraviolet light generation device according to claim 6, wherein the control unit
   creates a distribution chart of the energy from the measurement result of the EUV sensor in the irradiation position scanned by the irradiation position adjustment unit,
   determines, based on the distribution chart, an optimum position for the irradiation position of each of the second prepulse laser beam and the main pulse laser beam, and
   controls the irradiation position adjustment unit according to the optimum positions.

8. The extreme ultraviolet light generation device according to claim 7, wherein the control unit
   scans a difference time between the second delay time and the first delay time, and the second delay time,
   creates a first table showing correspondence of the energy to the difference time and the second delay time, and creates a second table showing correspondence of variations in the energy to the difference time and the second delay time, from the measurement result of the EUV sensor in the scanned difference time and second delay time,
   determines optimum times for the difference time and the second delay time based on the first and second tables, and
   sets the first and second delay times according to the optimum times in the delay circuit.

9. The extreme ultraviolet light generation device according to claim 8, wherein the control unit
   determines, as the optimum position, the irradiation position with maximum energy in the distribution chart, and
   determines, as the optimum times, the difference time and the second delay time with the variations being within a predetermined range in the second table and with maximum energy in the first table.

10. The extreme ultraviolet light generation device according to claim 8, wherein the control unit
    determines, as the optimum position, the irradiation position with maximum energy in the distribution chart, and
    determines, as the optimum times, the difference time and the second delay time with the energy being within a predetermined range in the first table and with minimum variations in the second table.

11. The extreme ultraviolet light generation device according to claim 6, further comprising a laser sensor configured to measure energy of the main pulse laser beam, wherein the control unit
    creates a distribution chart of generation efficiency of the energy from the measurement result of the EUV sensor and a measurement result of the laser sensor in the irradiation position scanned by the irradiation position adjustment unit, determines an optimum position for the irradiation position of each of the second prepulse laser beam and the main pulse laser beam based on the distribution chart, and controls the irradiation position adjustment unit according to the optimum positions.

12. The extreme ultraviolet light generation device according to claim 11, wherein the control unit scans a difference time between the second delay time and the first delay time, and the second delay time, creates a third table showing correspondence of the generation efficiency to the difference time and the second delay time, and creates a fourth table showing correspondence of variations in the generation efficiency to the difference time and the second delay time, from the measurement result of the EUV sensor and the measurement result of the laser sensor in the scanned difference time and second delay time, determines optimum times for the difference time and the second delay time based on the third and fourth tables, and sets the first and second delay times according to the optimum times in the delay circuit.

13. An extreme ultraviolet light generation device comprising:

an EUV sensor configured to measure energy of extreme ultraviolet light generated when a target is irradiated with a plurality of laser beams in a predetermined region in a chamber;

an irradiation position adjustment unit configured to adjust at least one of irradiation positions of the laser beams with which the target is irradiated in the predetermined region;

an irradiation timing adjustment unit configured to adjust at least one of irradiation timings of the laser beams with which the target is irradiated in the predetermined region; and a control unit configured to control the irradiation position adjustment unit and the irradiation timing adjustment unit, the laser beams including:

a first prepulse laser beam with which a primary target is irradiated at a first irradiation timing, the primary target being the target having been supplied to the predetermined region;

a second prepulse laser beam with which a secondary target is irradiated at a second irradiation timing, the secondary target being the primary target having been irradiated with the first prepulse laser beam, and a main pulse laser beam with which a tertiary target is irradiated at a third irradiation timing, the tertiary target being the secondary target having been irradiated with the second prepulse laser beam, the irradiation position adjustment unit including:

a collecting optical system configured to collect the first and second prepulse laser beams and the main pulse laser beam in the predetermined region;

a first mirror optical system arranged on an optical path of the second prepulse laser beam before entering the collecting optical system, and configured to adjust the irradiation position of the second prepulse laser beam on the secondary target; and a second mirror optical system arranged on an optical path of the main pulse laser beam before entering the collecting optical system, and configured to adjust the irradiation position of the main pulse laser beam on the tertiary target, and the control unit controlling the irradiation position adjustment unit to control the second mirror optical system, the first mirror optical system, and the collecting optical system in this order so that the irradiation position is scanned and then controlling the irradiation timing adjustment unit based on a measurement result of the EUV sensor.

14. The extreme ultraviolet light generation device according to claim 13, further comprising a pointing sensor configured to measure pointing of the main pulse laser beam, wherein the control unit controls the second mirror optical system so that the irradiation position of the main pulse laser beam is scanned based on a measurement result of the pointing sensor.

15. The extreme ultraviolet light generation device according to claim 13, wherein the irradiation timing adjustment unit includes a delay circuit configured to adjust the first irradiation timing to a timing when the primary target is supplied to the predetermined region, adjust the second irradiation timing by adding a first delay time to the first irradiation timing, and adjust the third irradiation timing by adding a second delay time to the first irradiation timing, and the control unit sets the first and second delay times in the delay circuit when controlling the irradiation timing adjustment unit.

16. The extreme ultraviolet light generation device according to claim 15, wherein the control unit creates a distribution chart of the energy from the measurement result of the EUV sensor in the irradiation position scanned by the irradiation position adjustment unit, determines, based on the distribution chart, an optimum position for the irradiation position of each of the second prepulse laser beam and the main pulse laser beam, and controls the irradiation position adjustment unit according to the optimum positions.

17. The extreme ultraviolet light generation device according to claim 16, wherein the control unit scans a difference time between the second delay time and the first delay time, and the second delay time, creates a first table showing correspondence of the energy to the difference time and the second delay time, and creates a second table showing correspondence of variations in the energy to the difference time and the second delay time, from the measurement result of the EUV sensor in the scanned difference time and second delay time, determines optimum times for the difference time and the second delay time based on the first and second tables, and sets the first and second delay times according to the optimum times in the delay circuit.

18. The extreme ultraviolet light generation device according to claim 17, wherein the control unit determines, as the optimum position, the irradiation position with maximum energy in the distribution chart, and determines, as the optimum times, the difference time and the second delay time with the variations being within a predetermined range in the second table and with maximum energy in the first table.

19. The extreme ultraviolet light generation device according to claim 15, further comprising a laser sensor configured to measure energy of the main pulse laser beam, wherein the control unit creates a distribution chart of generation efficiency of the energy from the measurement result of the EUV sensor and a measurement result of the laser sensor in the irradiation position scanned by the irradiation position adjustment unit, determines an optimum position for the irradiation position of each of the second prepulse laser beam and the main pulse laser beam based on the distribution chart, and controls the irradiation position adjustment unit according to the optimum positions.

20. The extreme ultraviolet light generation device according to claim 19, wherein the control unit scans a difference time between the second delay time and the first delay time, and the second delay time, creates a third table showing correspondence of the generation efficiency to the difference time and the second delay time, and creates a fourth table showing correspondence of variations in the generation efficiency to the difference time and the second delay time, from the measurement result of the EUV sensor and the measurement result of the laser sensor in the scanned difference time and second delay time, determines optimum times for the difference time and the second delay time based on the third and fourth tables, and sets the first and second delay times according to the optimum times in the delay circuit.

* * * * *